(12) United States Patent
Shimazaki et al.

(10) Patent No.: US 6,345,010 B2
(45) Date of Patent: Feb. 5, 2002

(54) SEMICONDUCTOR STORAGE DEVICE

(75) Inventors: Yasuhisa Shimazaki, Tachikawa (JP);
Kenichi Osada, San Jose, CA (US);
Hiroshi Maruyama, Yokohama;
Naotoshi Nishioka, Fuchu, both of (JP)

(73) Assignees: Hitachi, Ltd.; Hitachi ULSI Systems Co., Ltd., both of Tokyo (JP)

(*) Notice: Subject to any disclaimer, the term of this patent is extended or adjusted under 35 U.S.C. 154(b) by 0 days.

(21) Appl. No.: 09/754,132

(22) Filed: Jan. 5, 2001

Related U.S. Application Data

(63) Continuation of application No. 09/219,416, filed on Dec. 23, 1998, now abandoned.

(30) Foreign Application Priority Data

Dec. 26, 1997 (JP) .............................. 9-359276

(51) Int. Cl.$^7$ ................................. G11C 8/00
(52) U.S. Cl. ..................... 365/230.03; 365/69; 365/207
(58) Field of Search ............................. 365/63, 51, 69, 365/190, 207, 230.03

(56) References Cited

U.S. PATENT DOCUMENTS

| 5,500,820 A | 3/1996 | Nakaoka | 365/190 |
|---|---|---|---|
| 5,675,529 A | 10/1997 | Poole | 365/63 |
| 5,886,919 A * | 3/1999 | Morikawa | 365/69 |
| 6,091,629 A * | 7/2000 | Osada | 365/156 |

FOREIGN PATENT DOCUMENTS

| JP | 10-106269 | 4/1998 |
|---|---|---|

* cited by examiner

Primary Examiner—A. Zarabian
(74) Attorney, Agent, or Firm—Mattingly, Stanger & Malur, P.C.

(57) ABSTRACT

A semiconductor storage device controls crosstalk of write data to read data during reading and writing operations performed in the same cycle. The device has a plurality of word lines WL, a plurality of bit lines LBL, memory cells CELL which are connected to the word lines and the bit lines, reading global bit lines RGBL connected to a sense amplifier SA and writing global bit lines WBGL connected to a write amplifier WA. A selection circuit YSWn selectively connects the reading and writing global bit lines with the local bit lines. For first and second writing global bit lines arranged between first and second reading global bit lines, a distance between the first writing global bit line and the first reading global bit line, or a distance between the second writing global bit line and the second reading global bit line being is longer than a distance between the first and second writing global bit lines. Alternatively, the writing and reading global bit lines are formed in different wiring layers in the substrate of the device.

7 Claims, 19 Drawing Sheets

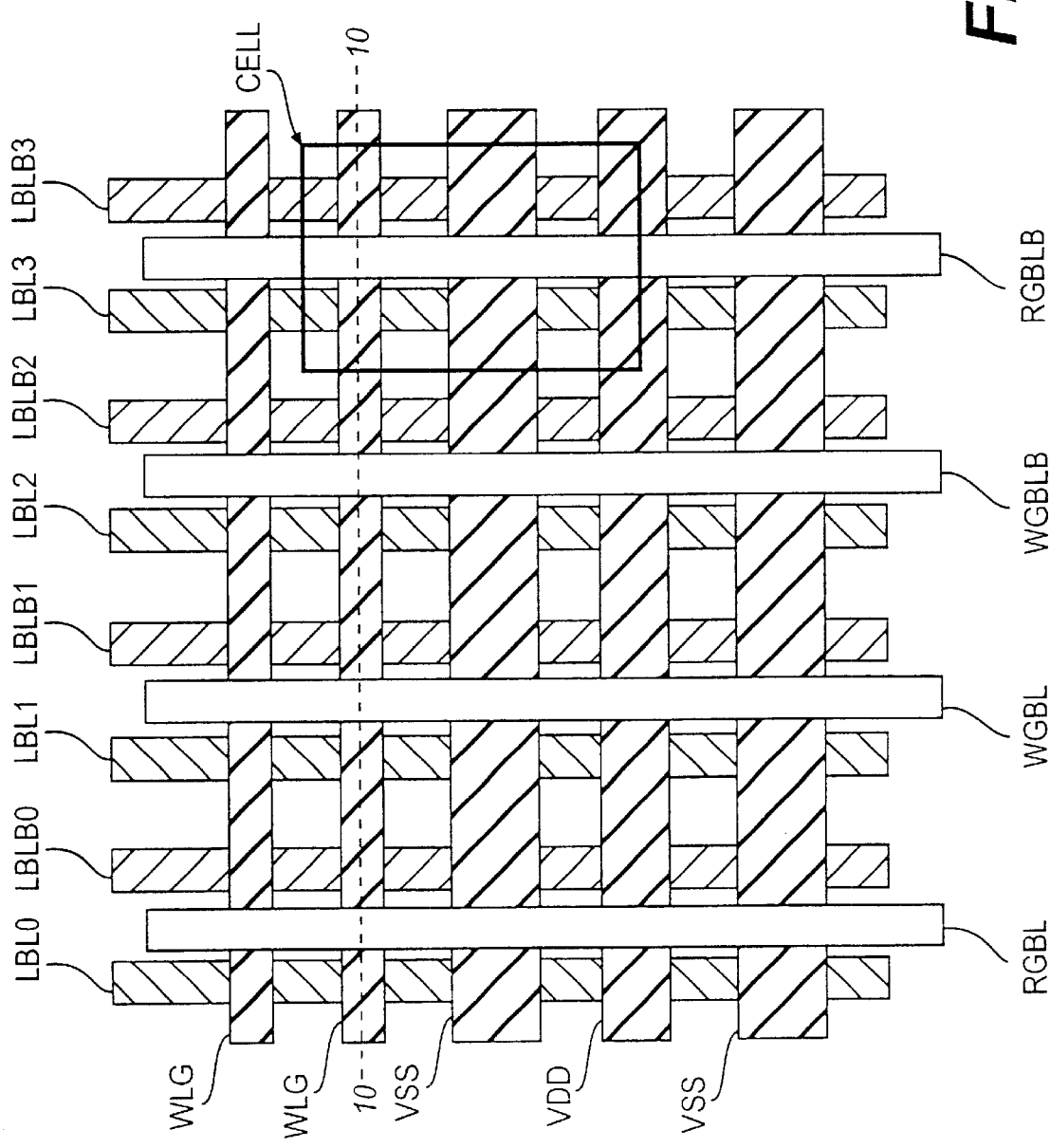

SEMICONDUCTOR STORAGE DEVICE

This is a continuation application of U.S. Ser. No. 09/219,416, filed Dec. 23, 1998 now abandon.

FIELD OF THE INVENTION

The present invention relates to a semiconductor storage device, and more particularly to a cache memory which is to be incorporated in a data processor such as microprocessor or microcomputer.

BACKGROUND OF THE RELATED ART

It is desirable for increasing the operating speed of a cache memory that the writing and reading operations of the cache can be concurrently performed. A construction for executing read/write parallel processing for this purpose by the use of two global bit lines is disclosed in related Japanese Patent Application No. 16223/1997.

SUMMARY OF THE INVENTION

In the related art, the problem of crosstalk arises by operating the two global bit lines in parallel. It is an object of the present invention to realize fast access in a semiconductor storage device while avoiding the problem of crosstalk. According to the present invention, a layout or structure of a semiconductor storage device which is well suited to a cache memory contributes to increasing the operating speed of the device.

A semiconductor storage device according to one aspect of the invention includes a plurality of word lines, a plurality of bit lines, memory cells which are connected to the word lines and the bit lines, a sensing (reading) global bit line which is connected to a sense amplifier, a writing global bit line which is connected to a write amplifier, and a selection circuit which selectively connects at least one of the sensing and writing global bit lines with the bit line.

According to this aspect, the first and second writing global bit lines are arranged between the first and second sensing global bit lines, with the first writing global bit line held adjacent to the first sensing global bit line and with the second writing global bit line held adjacent to the second sensing global bit line; and the distance between the first writing global bit line and the first sensing global bit line, or the distance between the second writing global bit line and the second sensing global bit line is set longer than the distance between the first and second writing global bit lines. With such a construction, the crosstalk between the writing and reading global bit lines, especially the influence of the writing bit lines on the reading bit lines can be relieved.

In a practical device application of the invention, the writing global bit lines and the sensing global bit lines are made of an identical wiring layer, and the distance between the writing global bit lines is greater than the distance between adjacent pairs of the writing and sensing global bit lines. On this occasion, a first wiring layer for making the bit lines, a second wiring layer for making the word lines, and a third wiring layer for making the writing and sensing global bit lines can be formed, as counted from a substrate side.

As another example, the writing global bit lines and the sensing global bit lines are made of different wiring layers, and the horizontal distance between the writing global bit lines and the sensing global bit lines is substantially the same. With this arrangement, the effect of relieving the crosstalk can be attained by using different layers without changing the pitches between the bit lines.

As a practical device, the semiconductor storage device can be so constructed that a first wiring layer for making the bit lines, a second wiring layer for making the word lines, a third wiring layer for making the sensing global bit lines, and a fourth wiring layer for making the writing global bit lines are formed as counted from a substrate side.

Further, it is suitable to provide a part of an arrangement in which the first writing global bit line and the second writing global bit line cross over/under one another. More specifically, the first writing global bit line and the second writing global bit lines cross over or under so that their positions (bit line positions) alternate periodically. Owing to such an arrangement, the crosstalk influence of the writing global bit lines can be relieved.

According to a practical application of the invention, a device is provided having a plurality of word lines, a plurality of bit lines, memory cells which are connected to the word lines and the bit lines, sensing global bit lines which are connected to a sense amplifier, writing global bit lines which are connected to a write amplifier, and a selection circuit which selectively connects at least one of the sensing and writing global bit lines with the bit line; and a part of an arrangement of the global bit lines in which two adjacent ones of the writing global bit lines cross over/under one another.

Here, the two adjacent writing global bit lines may well be arranged between two of the sensing global bit lines. Further, the shortest distance between the writing global bit lines should desirably be longer than the shortest distance between the writing global bit line and the sensing global bit line.

In a practical circuit layout, the plurality of word lines, the plurality of bit lines, and the memory cells connected to the word lines and the bit lines form a first region of a rectangular shape, and a second region of rectangular shape in which the selection circuit is arranged is located along one side of the first region, and that the sensing global bit lines and the writing global bit lines traverse the first and second regions in a direction which is orthogonal to the one side.

Herein, the two writing global bit lines may cross over/under one another in the second region. Besides, a plurality of sets each including the first and second regions may well be arranged in a direction in which the sensing global bit lines and the writing global bit lines extend, so as to define a train of memory banks. Further, a third region which includes the sense amplifier and the write amplifier may well be provided at one end of the memory bank train. It is also contemplated by the invention to arrange two such memory bank trains in parallel and to interpose a decoder/word driver between the two trains.

The layout of a semiconductor storage device proposed by the present invention includes a first region of rectangular shape which is formed by a plurality of word lines, a plurality of bit lines, and memory cells connected to the word lines and the bit lines, sensing global bit lines which are connected to a sense amplifier, writing global bit lines which are connected to a write amplifier, and a selection circuit which selectively connects at least one of the sensing and writing global bit lines with the bit line.

Herein, a second region of rectangular shape in which the selection circuit is arranged is located along one side of the first region, and the sensing global bit lines and the writing global bit lines traverse the first and second regions in a direction which is orthogonal to the one side. Further, a plurality of sets each including the first and second regions are arranged in a direction in which the sensing global bit lines and the writing global bit lines extend, so as to define a train of memory banks, and a third region which includes the sense amplifier and the write amplifier is provided at one end of the memory bank train.

In particular, the sense amplifier should desirably be located nearer to the memory bank train than the write amplifier. The reason therefor is that the sense amplifier handles weaker or more feeble signals. It is also contemplated that the sense amplifier includes sense amplifiers of a first stage, a middle stage and a rear stage arranged in such an order as viewed from a side which is nearest to the memory bank train, and that a gate length of each of transistors constituting the first stage is greater than a gate length of each of the transistors constituting the middle stage and the rear stage. From the standpoint of a manufacturing process, dummy transistors which do not operate may well be included among the transistors constituting the first stage.

The transistors constituting the middle stage or the rear stage may, in one arrangement, have their sources, gates and drains arrayed in the direction in which the sensing global bit lines and the writing global bit lines extend. The selection circuit includes a reading selection switch and a writing selection switch, with the reading selection switch preferably arranged nearer to the first region than the writing selection switch.

In addition, when two writing global bit lines are arranged in parallel so as to cross over/under to exchange their lateral positions periodically, the influence of the writing global bit lines on the sensing global bit lines can be relieved. In such a case, it is suitable that the writing global bit lines cross in the second region.

Further, if the places in which the writing global bit lines cross in one of the second regions are nearer to the first region than the selection circuit, the places in which the writing global bit lines cross in a different adjacent one of the second regions are set remoter from the first region than the selection circuit. With such an alternate arrangement, the lateral positional relations of the two global bit lines become the same within the train of all the memory banks, so that the design and manufacture of the semiconductor storage device are simplified.

MODES FOR CARRYING OUT THE INVENTION

Now, several preferred embodiments of a semiconductor storage device according to the present invention will be described with reference to the drawings.

BRIEF DESCRIPTION OF THE DRAWINGS

FIG. 10A is a view of the layout of a memory mat portion in which crosstalk of write data is prone.

DETAILED DESCRIPTION OF THE PREFERRED EMBODIMENTS

Figure 1:
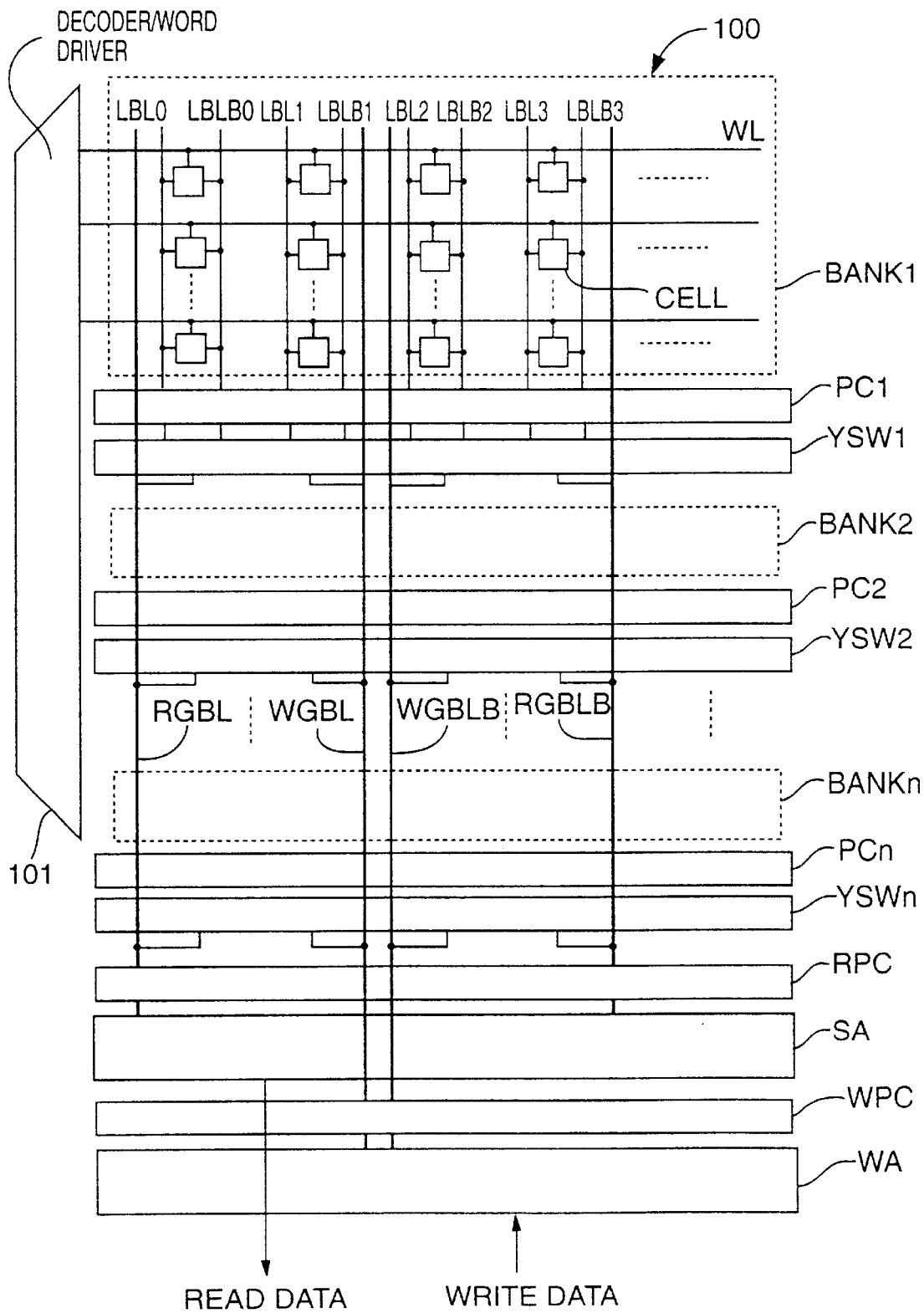
FIG. 1 is a circuit diagram of a semiconductor storage device according to the present invention.

FIG. 1 is a circuit diagram showing one embodiment of the semiconductor storage device according to the present invention. The semiconductor storage device 100 is formed in a monolithic semiconductor substrate such as of single-crystal silicon by the use of technologies for manufacturing semiconductor integrated circuits. A plurality of memory cells CELL are arranged in a matrix shape (of rows and columns) so as to constitute a memory array. The memory array is divided into n banks (BANK1–BANKn).

Here, symbols PC1–PCn denote precharge circuits, symbols YSW1–YSWn denote Y switches, symbol SA denotes a sense amplifier which is shared by the respective banks, symbol WA denotes a write amplifier which is shared by the respective banks, symbol RPC denotes a circuit which precharges reading global bit lines, symbol WPC denotes a circuit which precharges writing global bit lines, symbol READ DATA denotes data which has been read out, symbol WRITE DATA denotes data which is to be written in, symbols WGBL and WGBLB denote the writing global bit lines, symbols RGBL and RGBLB denote the reading global bit lines, symbols LBL0, LBLB0, LBL1, LBLB1, LBL2, LBLB2, LBL3 and LBLB3 denote local bit lines, and numeral 101 denotes a decoder/word driver.

Figure 2:
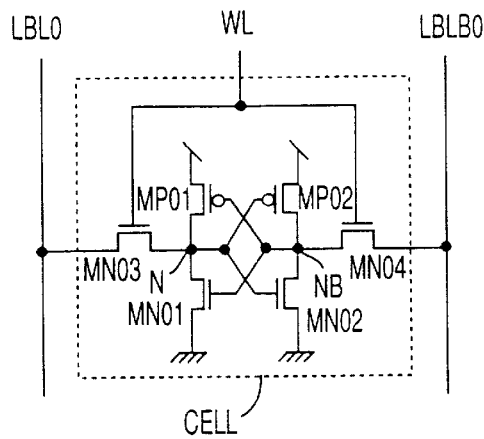
FIG. 2 is a circuit diagram of a cell in the storage device shown in FIG. 1.

FIG. 2 illustrates in detail the construction of a memory cell CELL shown in FIG. 1. The memory cell CELL includes a flip-flop (configured of P-channel type MOS transistors MP01, MP02 and N-channel type transistors MN01, MN02) which is so constructed so that the inputs and outputs of a pair of CMOS inverters are cross-connected, and N-channel type MOS transistors MN03, MN04 which selectively connect the node N and node NB of the flip-flop to the local bit lines (LBL0, LBLB0). A word line WL is connected to the gates of the N-channel type MOS transistors MN03, MN04.

Figure 3:
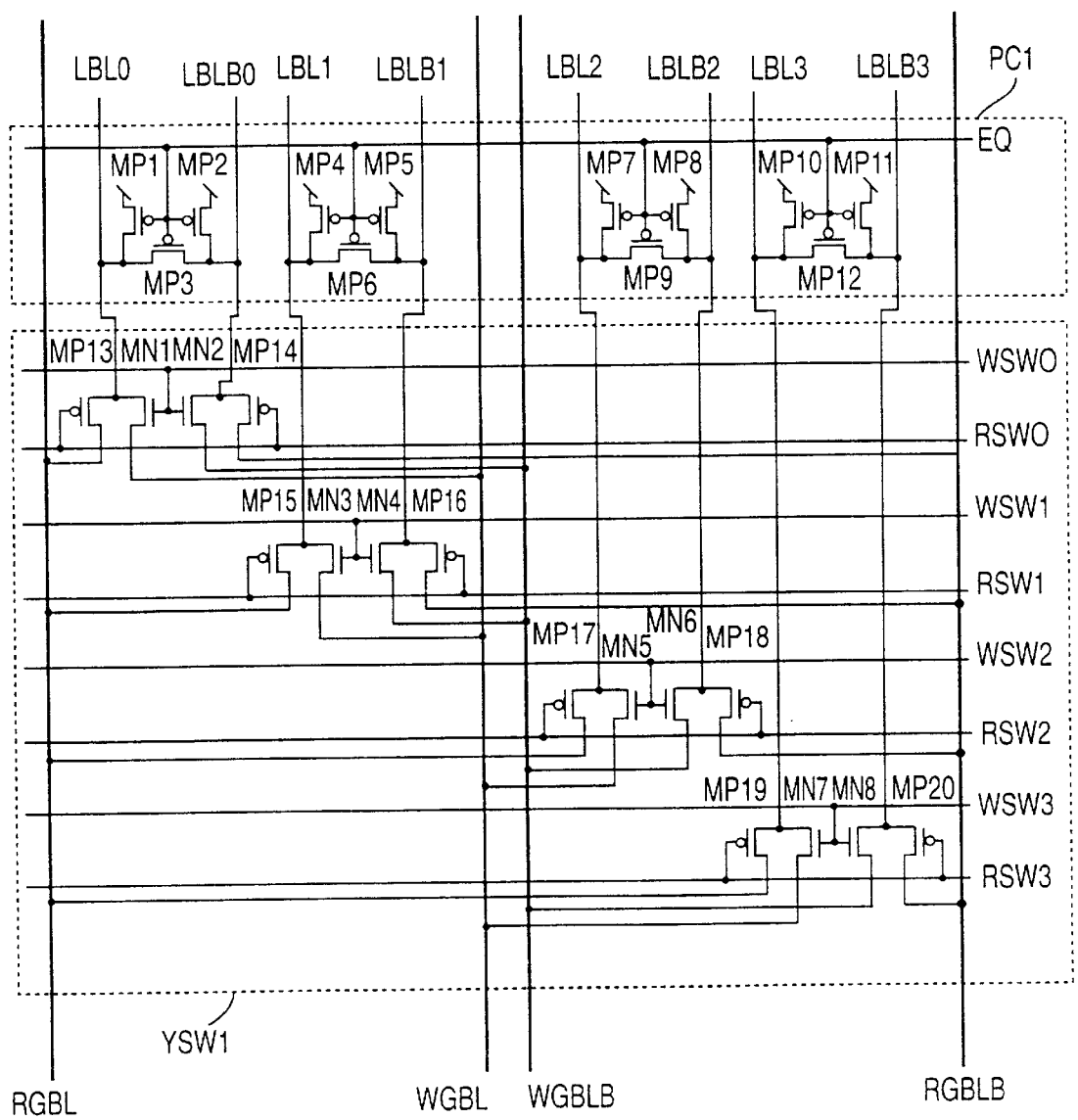
FIG. 3 is a circuit diagram of a Y switch and a local-bit-line precharge circuit in the case where global bit lines in one set are formed for four sets of local bit lines.

FIG. 3 illustrates in detail the constructions of the precharge circuit PC1 and the Y switch circuit YSW1 which are shown in FIG. 1. The local bit lines (LBL0, LBLB0, LBL1, LBLB1, LBL2, LBLB2, LBL3, LBLB3) which are bit lines within the bank can be precharged to a "HIGH" level by the use of P-channel type MOS transistors MP1–MP12. Besides, the local bit lines (LBL0, LBLB0, LBL1, LBLB1, LBL2, LBLB2, LBL3, LBLB3) are connected to the global bit lines (RGBL, RGBLB, WGBL, WGBLB) which are formed in parallel with the local bit lines so as to traverse the bank, through P-channel type MOS transistors MP13–MP20 and N-channel type MOS transistors MN1–MN8 in 4-column units.

The global bit lines are classified into the reading or sensing bit lines (RGBL, RGBLB) and the writing bit lines (WGBL, WGBLB). A signal line RSW0 is connected to the gates of the P-channel type MOS transistors MP13 and MP14. In the mode of reading data, the local bit lines (LBL0, LBLB0) are once precharged to the "HIGH" level by the precharge circuit PC1, and they merely oscillate near the "HIGH" level, so that the signals of the local bit lines (LBL0, LBLB0) can be transmitted to the data reading global bit lines (RGBL, RGBLB) by only the P-channel type MOS transistors. Similar connections are provided as shown in FIG. 3 for signal lines RSW1, RSW2 and RSW3 with respect to local bit lines LBL1, LBLB1, LBL2, LBLB2 and LBL3, LBLB3 through transistors MP15–MP20, respectively.

A signal line WSW0 is connected to the gates of the N-channel type MOS transistors MN1 and MN2. In the mode of writing data, the signals of the data writing global bit lines (WGBL, WGBLB) at a "LOW" level need to be exactly transmitted to the local bit lines (LBL0, LBLB0), but the signals thereof at the "HIGH" level pose no problem even when transmitted at somewhat lowered levels, so that the local bit lines (LBL0, LBLB0) and the data writing global bit lines (WGBL, WGBLB) may be connected by only the N-channel type MOS transistors MN1, MN2. Similar connections are provided as shown in FIG. 3 for signal lines WSW1, WSW2 and WSW3 with respect to local bit lines LBL1, LBLB1, LBL2, LBLB2 and LBL3, LBLB3 through transistors MN3–MN8, respectively. The data reading global bit lines (RGBL, RGBLB) are connected to the local bit lines through the Y switches (YSW1~YSWn), and they are also connected to the reading-global-bit-line precharge circuit RPC and the sense amplifier/latch circuit SA, as shown in FIG. 1.

Figure 4:
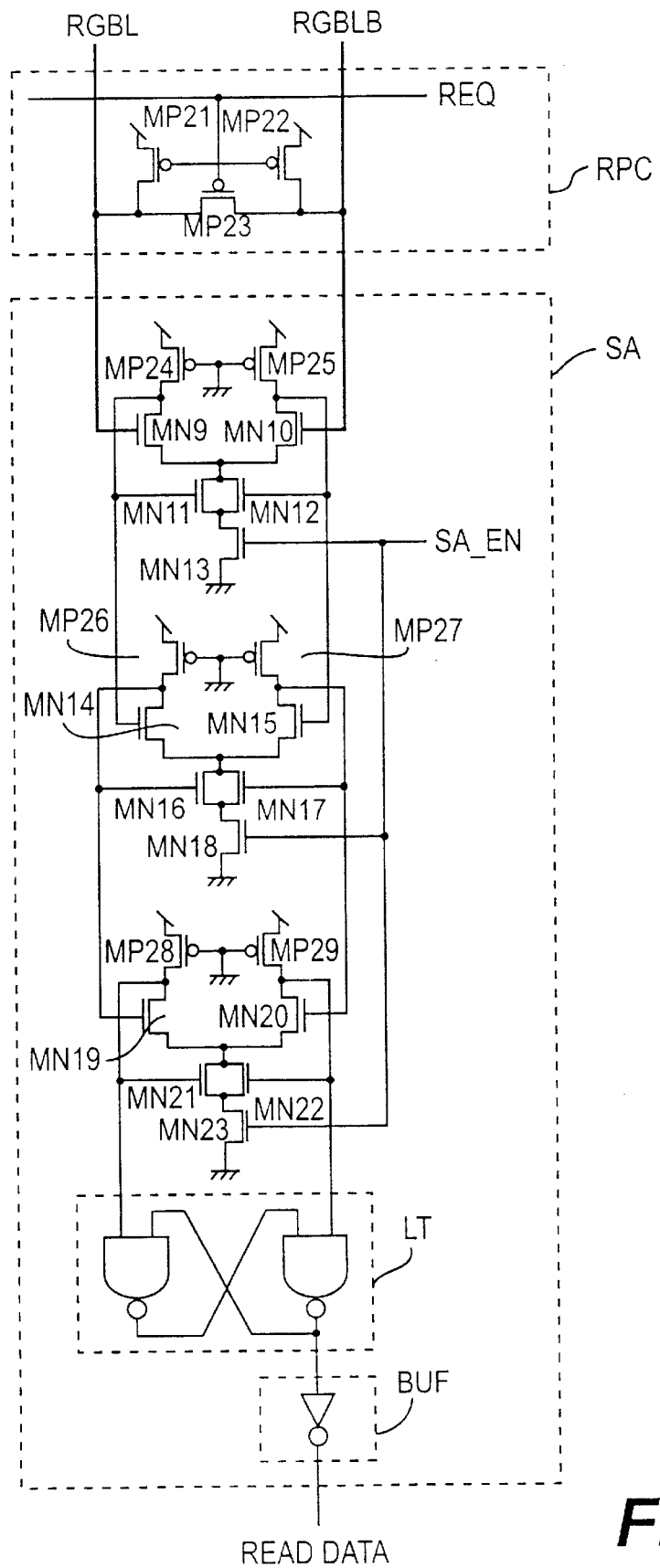
FIG. 4 is a circuit diagram of a sense amplifier and a reading-global-bit-line precharge circuit.

FIG. 4 illustrates in detail the arrangement of the reading-global-bit-line precharge circuit RPC and the sense amplifier/latch circuit SA which are shown in FIG. 1. The reading-global-bit-line precharge circuit RPC includes P-channel type MOS transistors MP21, MP22 and MP23, and it can precharge the reading global bit lines (RGBL, RGBLB) to the "HIGH" level. The sense amplifier/latch circuit SA includes a differential type sense amplifier (a first stage) which is configured of P-channel type MOS transistors MP24, MP25 and N-channel type MOS transistors MN9, MN10, MN11, MN12, MN13; a differential type sense amplifier (a middle stage) which is configured of transistors MP26, MP27 and MN14, MN15, MN16, MN17, MN18; a differential type sense amplifier (a rear stage) which is configured of transistors MP28, MP29 and MN19, MN20, MN21, MN22, MN23; a latch circuit LT which is configured of two NAND circuits; and further an output buffer BUF. The global bit lines (RGBL, RGBLB) are respectively connected to the gates of the N-channel type MOS transistors MN9 and MN10. A ground potential VSS is connected to the gates of the P-channel type MOS transistors MP24 and MP25. The data READ DATA that is read out is externally delivered from the output buffer BUF.

The data writing global bit lines (WGBL, WGBLB) are connected to the local bit lines through the N-channel type MOS transistors of the Y switches (YSW1~YWSn), and they are also connected to the writing-global-bit-line precharge circuit WPC and the write amplifier circuit WA.

Figures 5, 6:
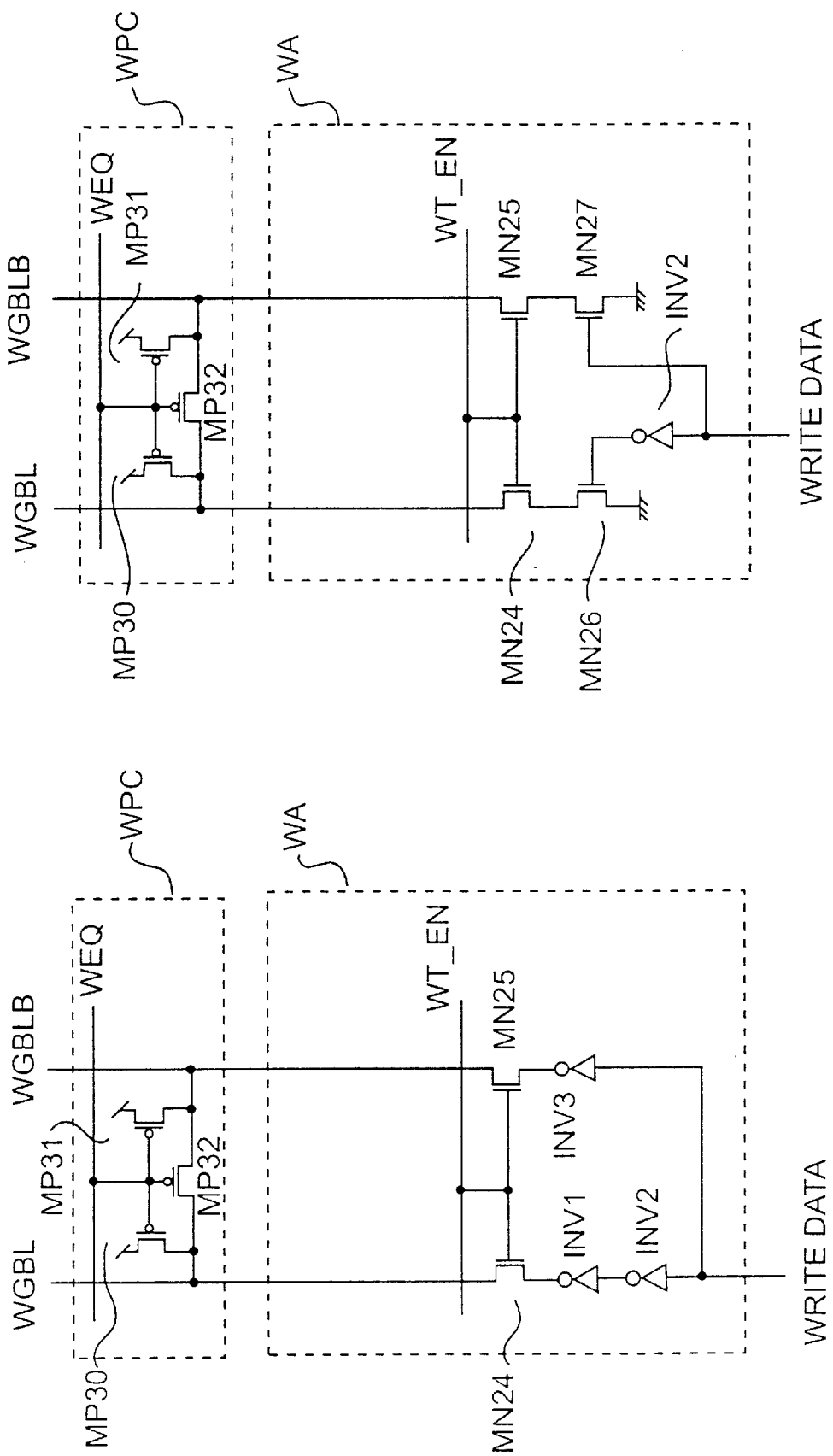
FIG. 5 is a circuit diagram of the writing global bit line precharge circuit and a write amplifier.
FIG. 6 is a circuit diagram of a modified embodiment of the write amplifier.

FIG. 5 illustrates in detail the arrangement of the writing-global-bit-line precharge circuit WPC and the write amplifier circuit WA which are shown in FIG. 1. The writing-global-bit-line precharge circuit WPC includes P-channel type MOS transistors MP30, MP31 and MP32, and it can precharge the writing global bit lines (WGBL, WGBLB) to the "HIGH" level. The write amplifier circuit WA includes inverter circuits INV1, INV2, INV3 and transistors MN24, MN25. The data WRITE DATA to be written is delivered to the writing global bit lines (WGBL, WGBLB) through the components INV1, INV2, INV3 and MN24, MN25.

As illustrated in FIG. 6, it is also possible to substitute transistors MN26 and MN27 for the respective inverters INV1 and INV3. In such an arrangement, when a line WT_EN reaches the "HIGH" level, either one of the lines WGBL and WGBLB is brought to the "LOW" level, and the other line is held at the precharge level (that is, the "HIGH" level), whereby the data is written into the memory cell. The decoder/word driver 101 (FIG. 1) is a circuit which selects one word line of any of the banks.

Figure 7:
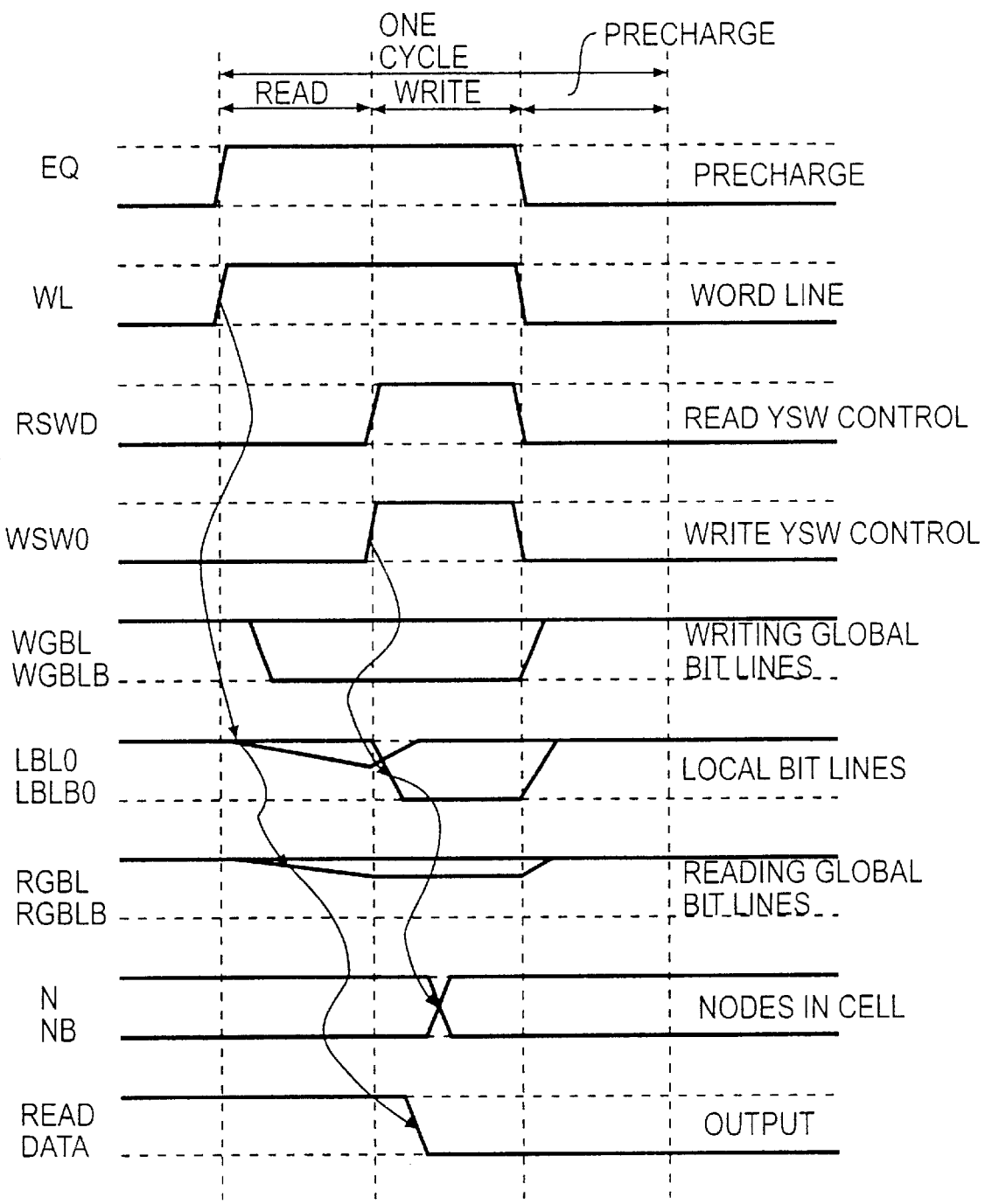
FIG. 7 is an operating waveform diagram of the embodiment shown in FIG. 1.

FIG. 7 illustrates operating waveforms in the case of successive reading and writing operations for an identical address in the semiconductor storage device shown in FIG. 1. The data reading operation is first executed, and the data writing operation is thereafter executed.

Before the start of the operations, the reading global bit lines (RGBL, RGBLB), signal lines REQ (refer to FIG. 3) and EQ, WEQ (refer to FIG. 5) are brought to the "L" ("LOW" level), whereby the local bit lines (LBL0, LBLB0, LBL1, LBLB1, LBL2, LBLB2, LBL3, LBLB3) and the writing global bit lines (WGBL, WGBLB) are respectively precharged to "H" ("HIGH" level) by precharge circuits RPC, PC and WEQ. In addition, the control signal RSW0 of the Y switch YSW1 is set at "L", and the control signals RSW1, RSW2 and RSW3 of the corresponding Y switches are set at "H", whereby the reading global bit lines (RGBL, RGBLB) and the local bit lines (LBL0, LBLB0) are connected in advance.

In the reading operation, the signal lines REQ and EQ are first at "H" to suspend the precharge. Simultaneously therewith, the word line WL is at "H", so that the precharged local bit lines (LBL0, LBLB0) are discharged by the memory cell CELL to develop a potential difference. Since the local bit lines (LBL0, LBLB0) and the reading global bit lines (RGBL, RGBLB) are connected, the potential difference between the local bit lines (LBL0, LBLB0) as developed by the memory cell CELL is transmitted to the reading global bit lines (RGBL, RGBLB). Further, the potential difference is transmitted to the sense amplifier/latch circuit SA and is amplified by setting a sense amplifier enabling signal SA_EN (refer to FIG. 4) at "H", whereupon the resulting data is delivered to the signal line READ DATA.

At the point of time at which the potential difference has been transmitted to the sense amplifier, the control signal RSW0 of the Y switch YSW1 is shifted from the "L" to the "H" level, whereby the P-channel type MOS transistors of the Y switch YSW1 are turned OFF to disconnect the local bit lines (LBL0, LBLB0) and the reading global bit lines (RGBL, RGBLB). Simultaneously, the control signal WSW0 of the Y switch YSW1 is shifted from "L" to "H", whereby the N-channel type MOS transistors of the Y switch YSW1 are turned ON to connect the local bit lines (LBL0, LBLB0) and the writing global bit lines (WGBL, WGBLB), and to start the writing operation. The writing global bit lines (WGBL, WGBLB) have been respectively charged and discharged beforehand by setting a write amplifier enabling signal WT_EN (refer to FIG. 5) at the "H" level during the reading operation. After the start of the writing operation, therefore, a signal is transmitted to and written into the memory cell CELL by charging and discharging only the respective local bit lines (LBL0, LBLB0) of small capacitances.

After the end of the writing operation, the word line WL is set at "L", the control signal RSW0 at "L", the control signal WSW0 at "L", and the signal lines REQ, EQ and WEQ at "L", whereby the reading global bit lines (RGBL, RGBLB), the local bit lines (LBL0, LBLB0, LBL1, LBLB1, LBL2, LBLB2, LBL3, LBLB3) and the writing global bit lines (WGBL, WGBLB) are precharged in preparation for the next cycle. The reading, writing and precharging operations are effected in one cycle.

Although, in FIG. 7, the precharge is illustrated so as to be done at the last part of one cycle, it may be done before the reading operation. That is, the precharge may well be similarly illustrated so as to be done at the first part of one cycle.

In this embodiment, the number of the memory cells CELL connected to the bit lines during the operation is as small as 1/n as compared with the number in a method which does not employ the global bit lines, so that the capacitances of the bit lines can be decreased to quicken the charge and discharge operations. This embodiment consequently brings forth also the effect that the speeds of the reading and writing operations are heightened. Also power dissipation can be lowered owing to the decrease in the capacitances of the bit lines.

Figure 8:
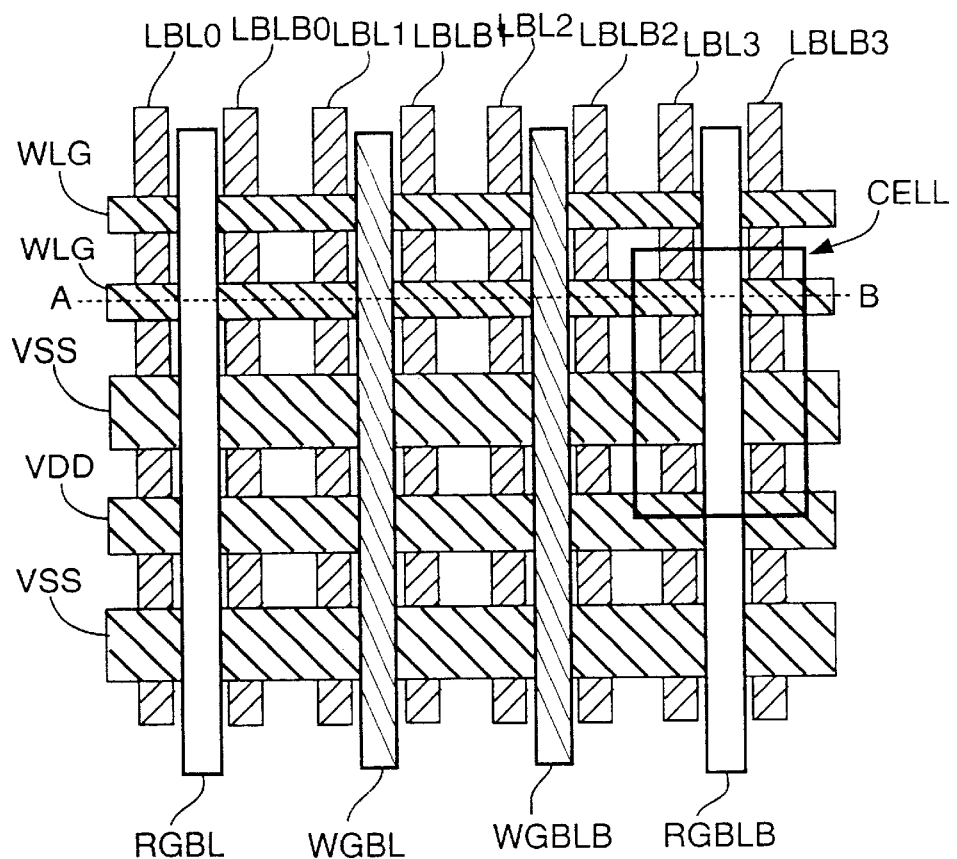
FIG. 8 is a plan view of the layout of a memory mat portion.

FIG. 8 illustrates the layout of the metal layers of the memory mat portion of the semiconductor storage device shown in FIG. 1. The global bit lines (RGBL, RGBLB) for reading data and the global bit lines (WGBL, WGBLB) for writing data are respectively wired at the rate of one pair to the four pairs of local bit lines (LBL0, LBLB0; LBL1, LBLB1; LBL2, LBLB2; LBL3, LBLB3).

Figure 9:
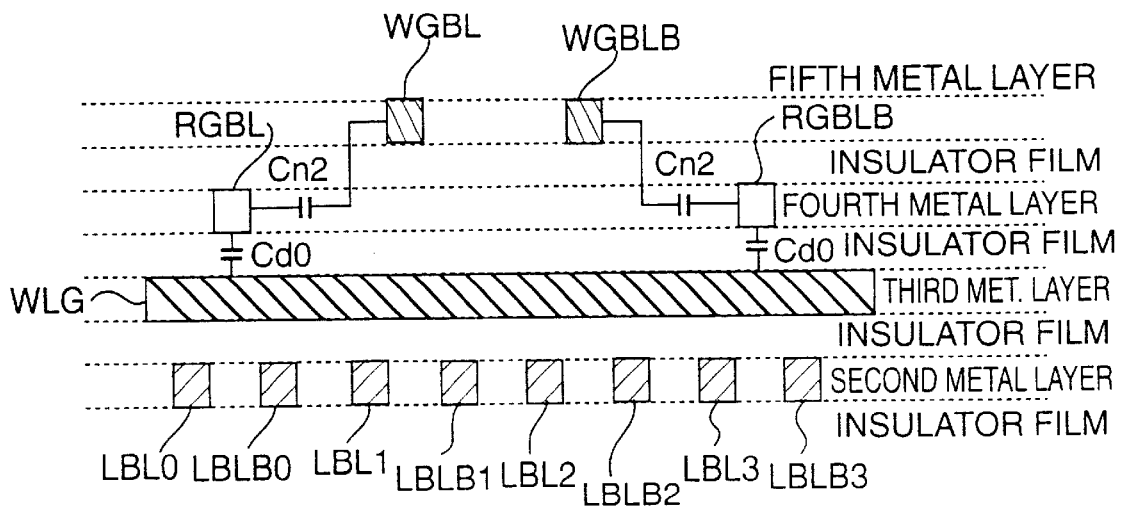
FIG. 9 is a sectional view of the layout of the memory mat portion.

FIG. 9 illustrates a sectional view taken along broken line 9—9 in FIG. 8. A first layer (not shown, but would be located at the bottom of the figure) is used as a memory cell portion CELL. The local bit lines (LBL0, LBLB0, LBL1, LBLB1, LBL2, LBLB2, LBL3, LBLB3) are made using a second layer of metal (referring to metal wiring). Reinforcement lines WLG for reducing the resistances of the word lines are made using a third layer of metal. Ground lines VSS and a supply voltage line VDD are made using a third layer of metal. The reading global bit lines (RGBL, RGBLB) are made using a fourth layer of metal. The writing global bit lines (WGBL, WGBLB) are made using a fifth layer of metal. Incidentally, although not shown, the first layer of metal is used in the memory cell portion. Besides, a region enclosed with a bold line expresses one memory cell CELL.

The global bit lines (RGBL, RGBLB, WGBL, WGBLB) are formed at the rate of one line to a memory cell of one column (for example, one pair of bit lines (LBL0, LBLB0)), so that the inter-line capacitances of the global bit lines (RGBL, RGBLB, WGBL, WGBLB) are decreased to correspondingly increase the speeds of the operations.

Figure 10B:
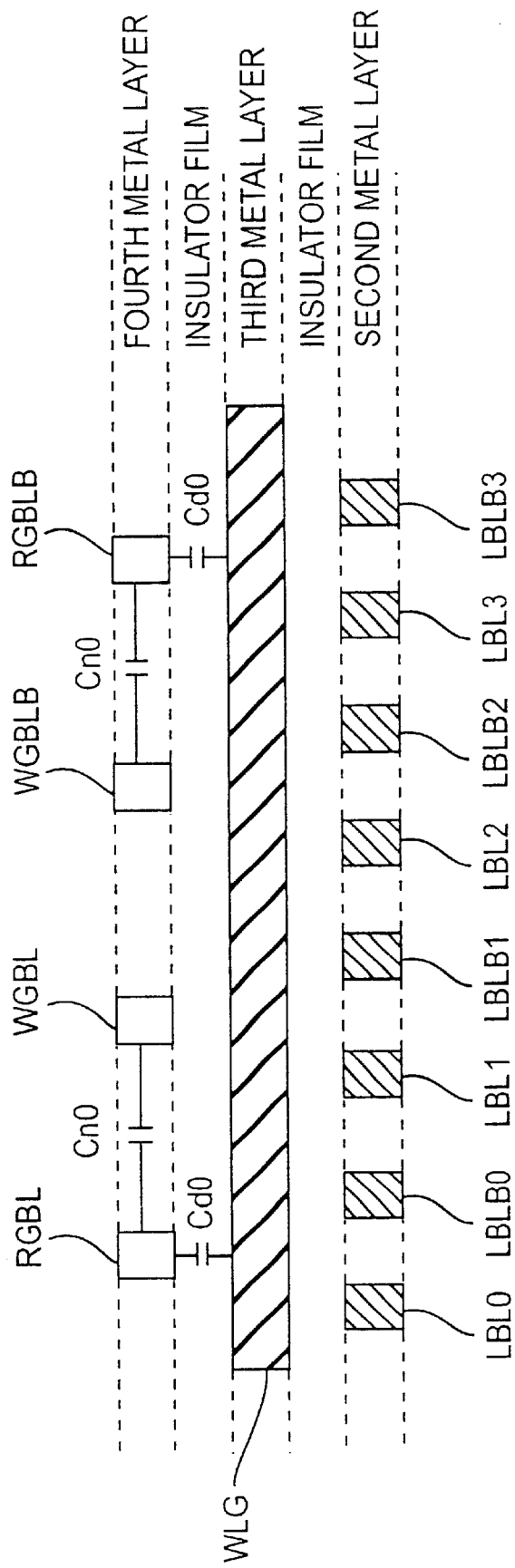
FIG. 10B is a cross section of the memory mat portion shown in FIG. 10 taken along section line 10—10.

FIG. 10A shows a layout of a memory mat in which the cross sectional view of the memory mat portion as shown in FIG. 10B, taken along a section of line 10—10. As shown, the writing global bit lines (WGBL, WGBLB) are made using a fourth layer of metal wiring. In this case, the reading global bit lines (RGBL, RGBLB) and the writing global bit lines (WGBL, WGBLB) are formed in the same metal layer, so that inter-wiring capacitances $Cn0$ take a relatively large value which will be considered for purposes of comparison in the following description.

Figure 11:
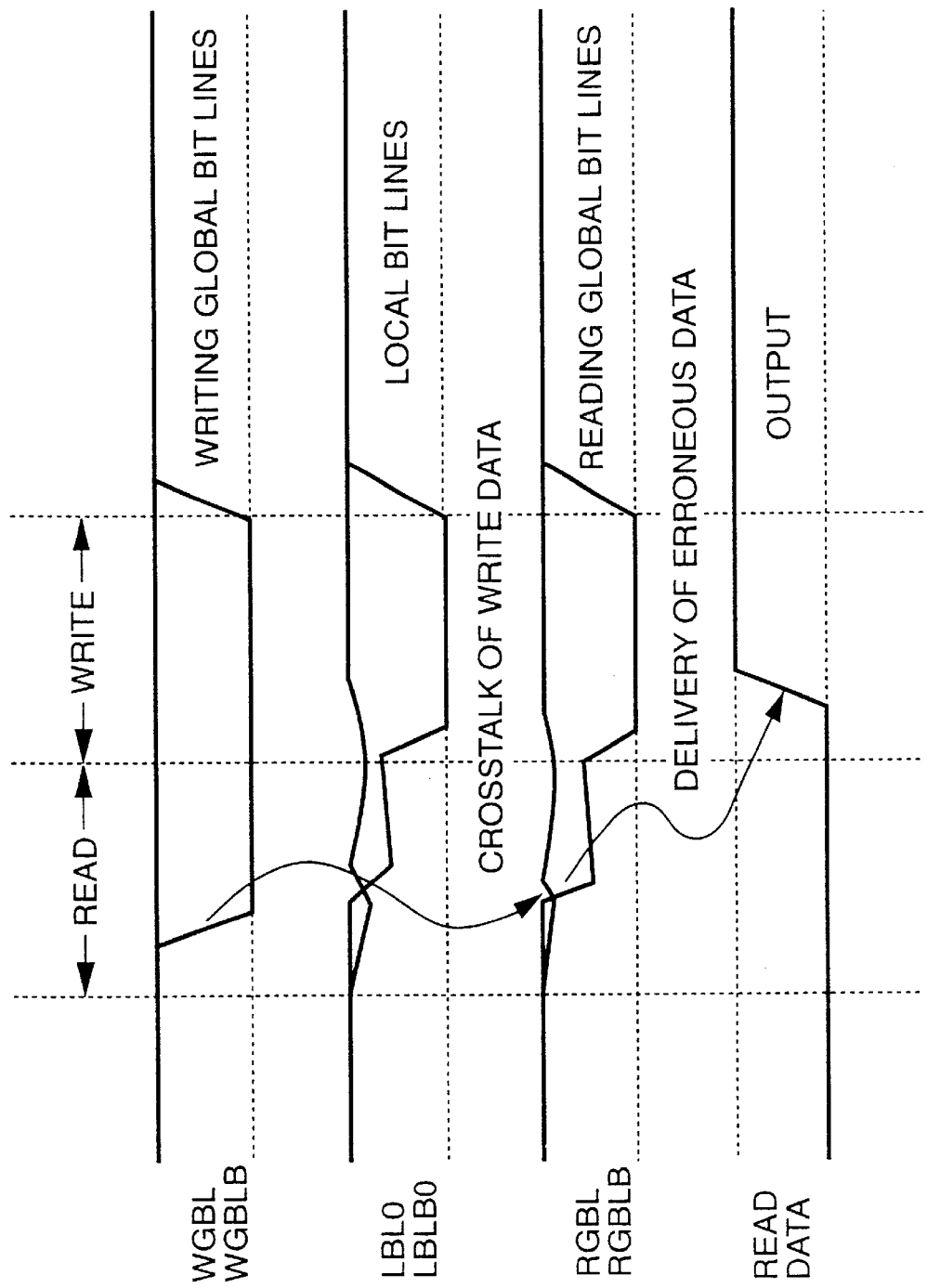
FIG. 11 is an operating waveform diagram in the case where read data is destroyed by the crosstalk of the write data.

FIG. 11 illustrates operating waveforms in the case where the inter-wiring capacitances $Cn0$ between the reading global bit lines (RGBL, RGBLB) and the writing global bit lines (WGBL, WGBLB) are large. The writing global bit lines (WGBL, WGBLB) are respectively charged and discharged during a reading operation beforehand. In this instance, the crosstalk of write data occurs in the reading global bit lines (RGBL, RGBLB) due to the large inter-wiring capacitances $Cn0$.

The reading global bit lines (RGBL, RGBLB) transmit a weak or feeble voltage amplitude from a memory cell, whereas the writing global bit lines (WGBL, WGBLB) transmit write data having the same amplitude as that of a supply voltage. Therefore, when crosstalk occurs, data on the reading global bit lines (RGBL, RGBLB) is easily destroyed, with the result that erroneous data is delivered.

In contrast, in the layout of FIGS. 8 and 9, the wiring layers of the reading global bit lines (RGBL, RGBLB) and the writing global bit lines (WGBL, WGBLB) are made different, so that inter-wiring capacitances $Cn2$ are smaller than those of $Cn0$, and the crosstalk of the write data can be suppressed.

Figure 12A:
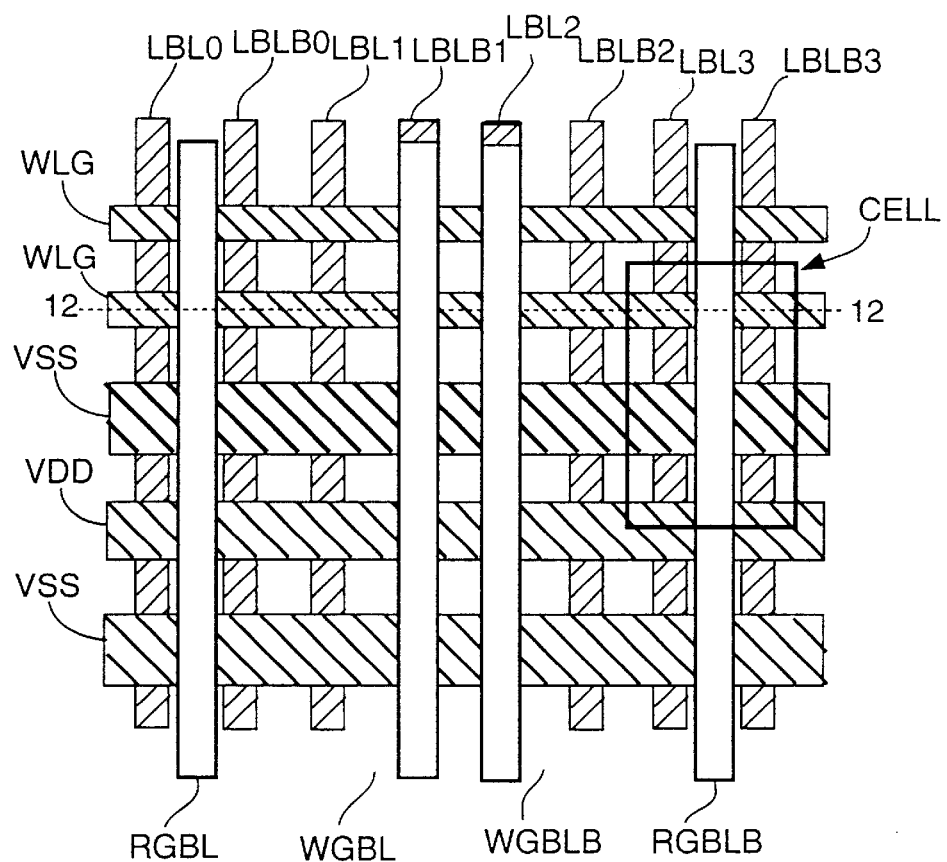
FIG. 12A is a view of the layout of a memory mat portion according to the present invention.
Figure 12B:
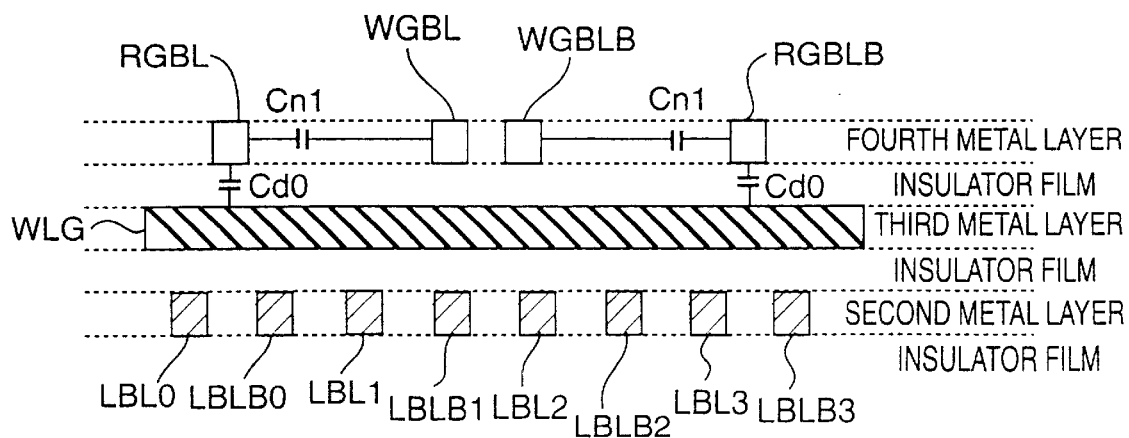
FIG. 12B is a cross section of the memory mat portion shown in FIG. 12A taken along section line 12—12.

FIG. 12A shows a layout of a memory mat portion according to another embodiment of the invention. FIG. 12B shows a corresponding sectional view of the memory mat shown in FIG. 12A and taken along section line 12—12 in FIG. 12A. As shown in the figures, reading global bit lines (RGBL, RGBLB) and writing global bit lines (WGBL, WGBLB) are made using a fourth layer of metal, and the wiring pitches of both are not equally spaced.

In particular, as shown in FIGS. 12A and 12B, first and second writing global bit lines WGBL, WGBLB are arranged between the first and second reading global bit lines RGBL, RGBLB, with first writing global bit line WGBL held adjacent to first reading global bit line RGBL and with the second writing global bit line WGBLB held adjacent to the second reading global bit line RGBLB; and the distance between the first writing global bit line WGBL and the first reading global bit line RGBL, or the distance between the second writing global bit line WGBLB and the second reading global bit line RGBLB is set longer than the distance between the first and second writing global bit lines WGBL and WGBLB. In this case, the inter-wiring capacitances $Cn1$ between the reading global bit lines (RGBL, RGBLB) and the writing global bit lines (WGBL, WGBLB) can be made smaller than those of $Cn0$, so that the crosstalk of the write data can be suppressed. Further, in each of the embodiments in FIGS. 8 and 9 and in FIG. 12A, the inter-wiring capacitances $Cn2$ or $Cn1$ are reduced with respect to $Cn0$ shown in FIG. 10B, so the operations of the global bit lines can be increased in speed and lowered in power dissipation.

Additionally, in each of the embodiments in FIGS. 8 and 9 and in FIG. 12, the writing global bit lines (WGBL, WGBLB) are laid between the reading global bit lines (RGBL, RGBLB), whereby the write data having the same amplitude as that of the supply voltage is prevented from inducing the crosstalk in adjacent global bit lines not shown. In general, the crosstalk gives rise to an unnecessary potential change (glitch) and therefore dissipates wasteful power. In this embodiment, accordingly, a lowered power dissipation can be simultaneously achieved.

In the embodiment of FIGS. 8 and 9, it is also important that the writing global bit lines (WGBL, WGBLB) are made using the fifth layer of metal. The crosstalk between the reading global bit lines (RGBL, RGBLB) and the writing global bit lines (WGBL, WGBLB) develops in a case where, of the parasitic capacitances (for example, Cd0 and Cn2) of the reading global bit lines (RGBL, RGBLB), the parasitic capacitance (Cn2) with respect to the writing global bit lines (WGBL, WGBLB) can have a large value which is not negligible.

Assuming in a different arrangement that the reading global bit lines (RGBL, RGBLB) are made using the fifth layer of metal, an inter-line capacitance corresponding to the capacitance Cd0 shown in FIG. 9 becomes a small value, but the capacitance Cn2 seems to have a large value relatively, so that the crosstalk of the write data develops. Besides, from the viewpoint of the transmission of the data between the memory cell and the global bit lines, the reading global bit lines (RGBL, RGBLB) which have the purpose of transmitting the weak or feeble signal from the memory cell need to use the metal lying at a layer close to the memory cell. The reason therefor is that, when the memory cell is connected to the metal lying at a layer remote from the layer of the memory cell (first layer), the signal must pass through "vias" (inter-metal contacts) many times, so the resistances and parasitic capacitances of the "vias" lower the operating speed of the storage device and increase the power dissipation thereof.

Figure 13:
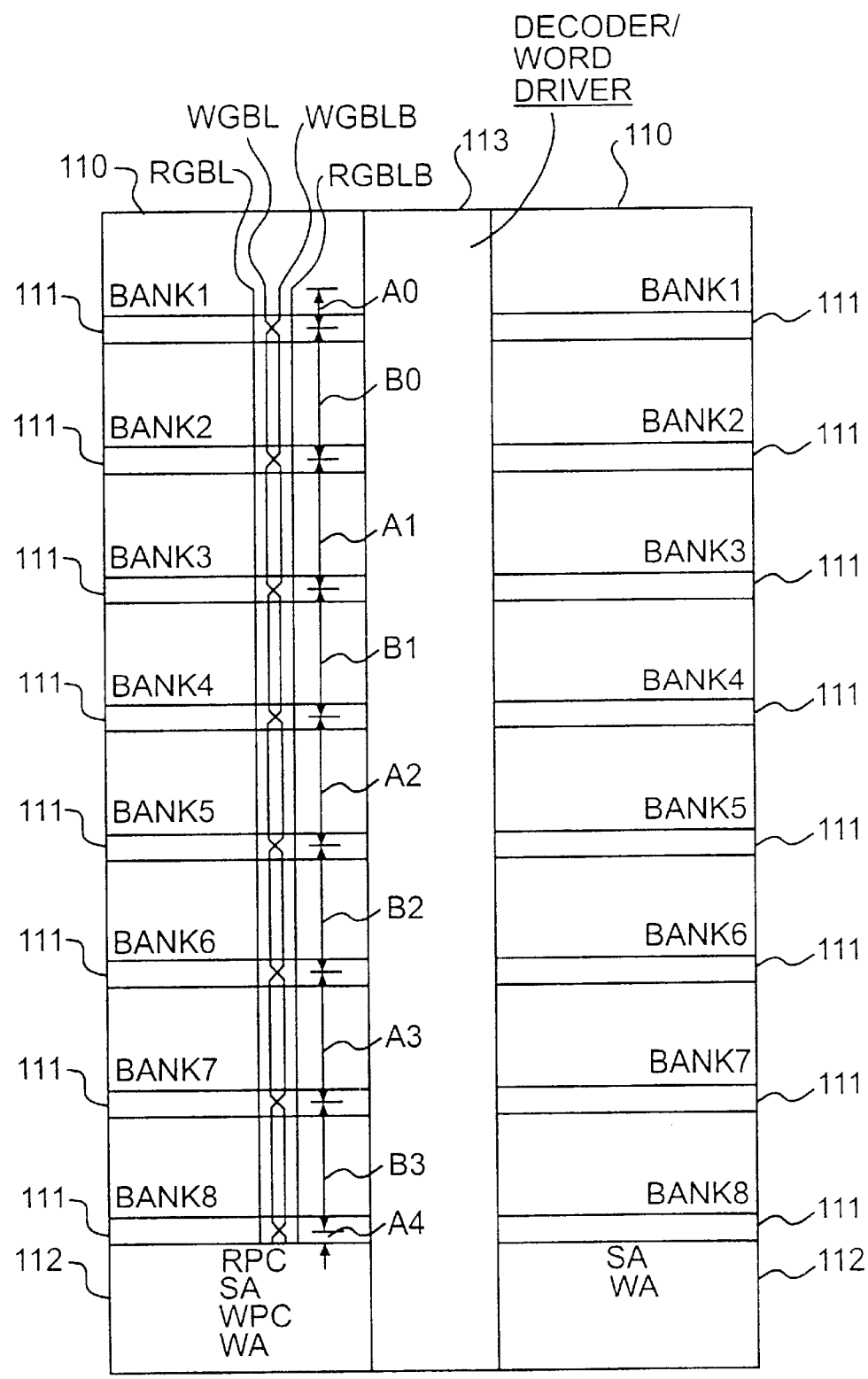
FIG. 13 is a plan view of the layout of a storage device to which the present invention is applied.

FIG. 13 illustrates the layout of a memory which has been fabricated incorporating the circuit techniques of the present invention. A region 110 is a memory array region and is broadly divided into two parts, each of which is subdivided into eight banks (BANK1~BANK8). Regions 111 include precharge circuits PCi and Y switches YSWi (i=1~8), and they are respectively arranged in adjacency to the eight banks (BANK1~BANK8). Additionally, a decoder/word driver 101 is arranged in a region 113.

Arranged in regions 112 are a circuit RPC which precharges reading global bit lines, sense amplifier/latch circuits SA, a circuit WPC which precharges writing global bit lines, and write amplifier circuits WA. Incidentally, for the sake of brevity, the reading global bit lines (RGBL, RGBLB) and the writing global bit lines (WGBL, WGBLB) in only one set are shown in the figure. The writing global bit lines (WGBL, WGBLB) are twisted layout-wise in the regions 111. In a case where the writing global bit lines (WGBL, WGBLB) are not twisted, the reading global bit line RGBL and the writing global bit line WGBL run in parallel over a long distance, and hence, the inter-wiring capacitance between both the bit lines enlarges.

In FIG. 13, A1, A2, B1, B2, B3 are showing the length between each twisted point of the global bit line (WGBL, WGBLB). Also, A0, A4 are showing the length from the end edge of the global bit line (WGBL, WGBLB) to the crossing point of the global bit line (WGBL, WGBLB). Accordingly, the layout should preferably satisfy the equality:

$$A0+A1+A2+A3+A4=B0+B1+B2+B3$$

In this way, the length of global bit line for reading (RGBL) along with the global bit line for writing (WGBLB) becomes equal to the length of global bit line for reading (RGBLB) along with the global bit line for writing (WGBL).

According to above layout, the crosstalk noise of the global bit line for reading (RGBL) from the global bit line for writing (WGBLB) is equal to the crosstalk noise of the global bit line for reading (RGBLB) from the global bit line for writing (WGBL). Therefore, this layout tends to cancel the crosstalk noise and avoid read out errors.

As illustrated in FIG. 7, the writing global bit lines (WGBL, WGBLB) are respectively charged and discharged during the reading operation beforehand. Therefore, when the inter-wiring capacitances of the writing global bit lines with respect to either of the reading global bit lines are large, the influence of the crosstalk of the write data increases. In order to prevent this drawback, the memory may be so laid out that the writing global bit lines (WGBL, WGBLB) run in parallel over the same length with respect to both the reading global bit lines (RGBL, RGBLB).

Figure 14:
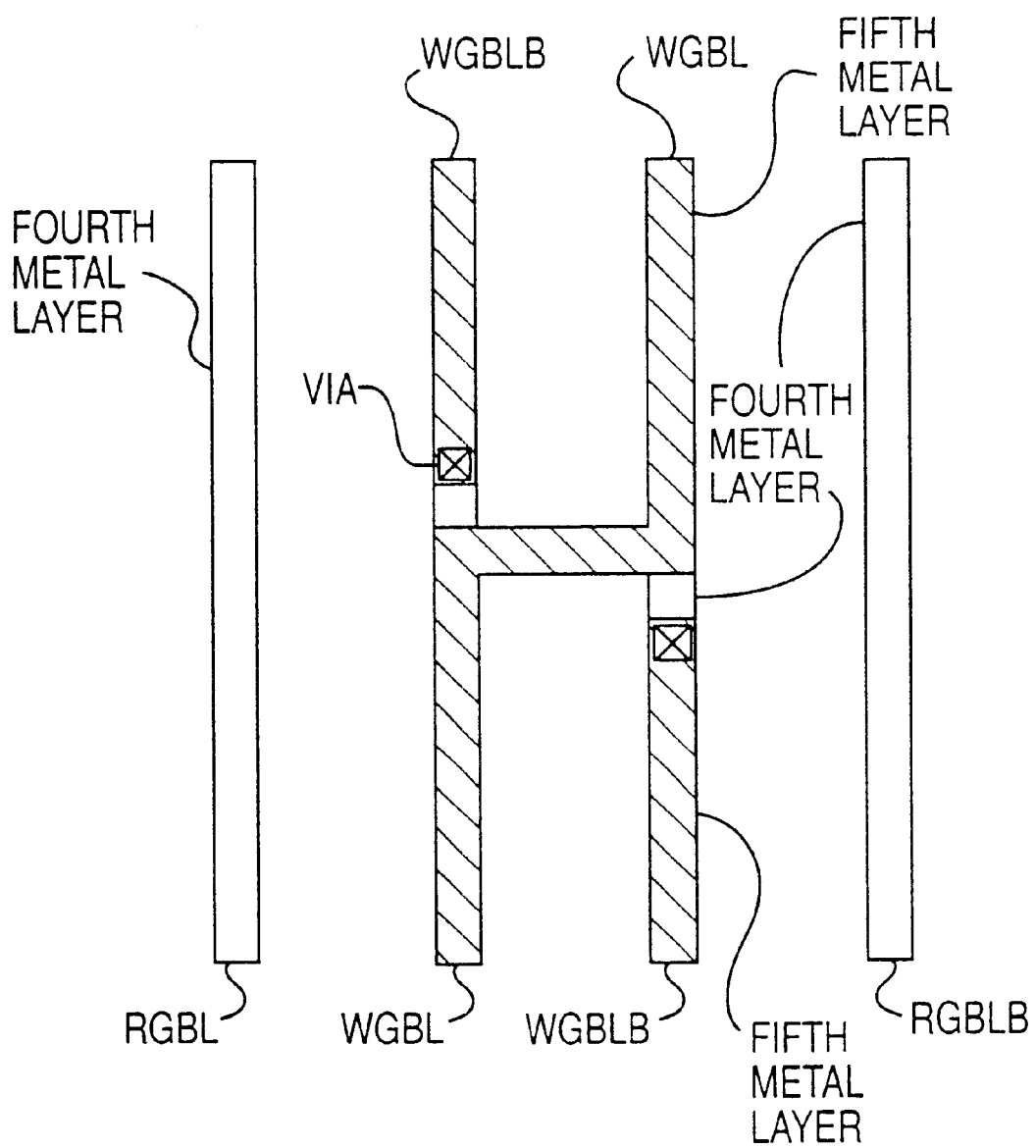
FIG. 14 is a plan view of a layout in the case of twisting the bit lines.

FIG. 14 illustrates the layout of a part (e.g., in regions 111) in which the writing global bit lines (WGBL, WGBLB) are twisted (to cross over/under one another) to shift the lateral positions thereof. Depicted in the figure is the layout in the case where the line WGBLB of the fifth layer of metal is arranged on the right lower side of the central part, where it is once changed-over to the fourth layer of metal (as indicated by the "X") and wired to a left running channel (not shown), and where it is thereafter changed-over to the fifth layer of metal again (as indicated by the other "X"). In the cross over/under part, the line WGBL is formed in the fifth layer of metal.

Figure 15:
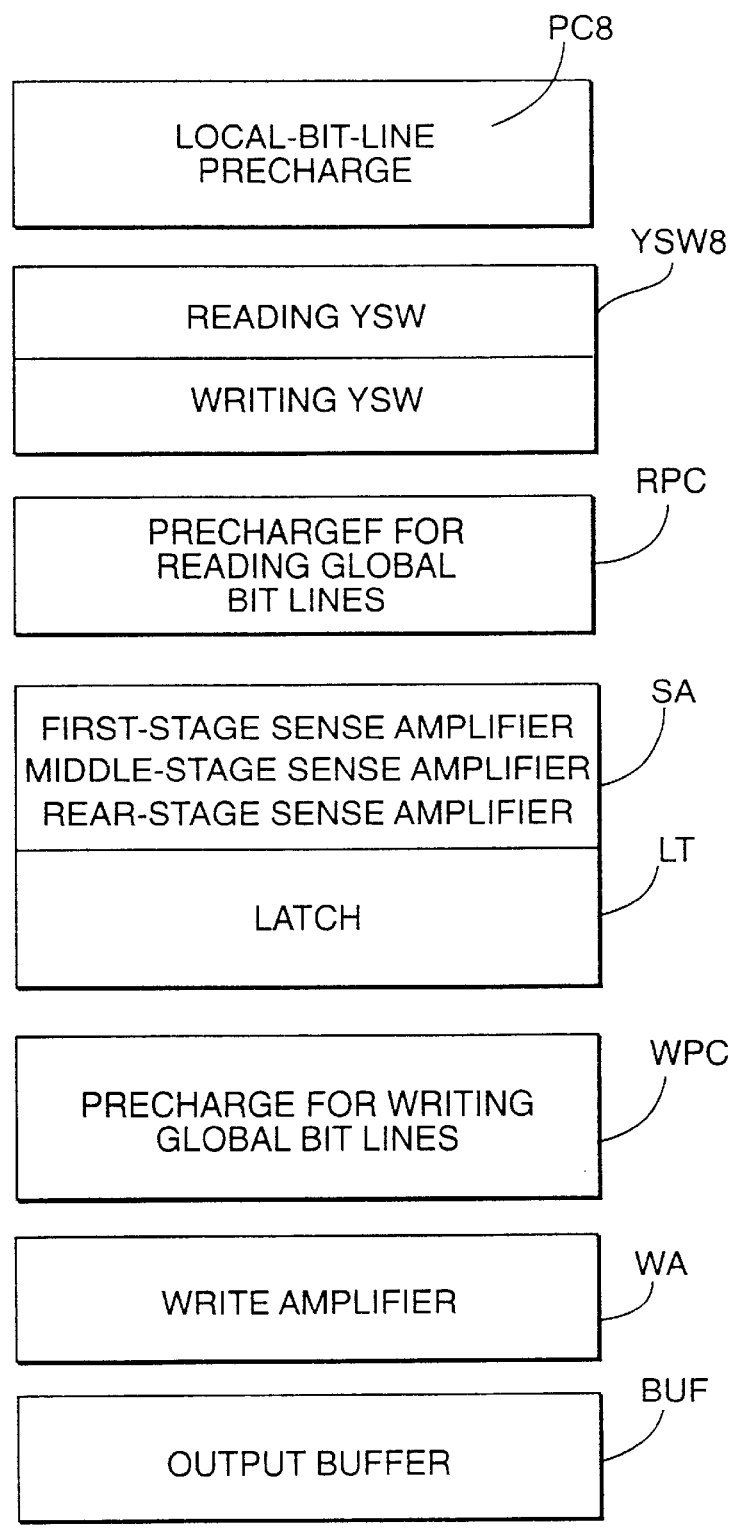
FIG. 15 is a layout view of a sense amplifier portion and a write amplifier portion.

FIG. 15 illustrates in more detail the layout image of the region 112 and the region 111 adjacent thereto as shown in FIG. 13. The upper side of FIG. 15 corresponds to the memory array side which is indicated as "BANK8" in FIG. 13. A local-bit-line precharging circuit PC8, a Y switch YS8, a reading-global-bit-line precharging circuit RPC, a sense amplifier SA, a latch circuit LT, a writing-global-bit-line precharging circuit WPC, a write amplifier WA, and an output buffer BUF are laid out in this order as viewed from the upper side. Here, local bit lines are to be connected to the local-bit-line precharging circuit PC8 and the Y switch YS8, which must therefore be located in adjacency to a memory array. Additionally, the reading-global-bit-line precharging circuit RPC, sense amplifier SA and latch circuit LT (hereinbelow, the constituents RPC, SA and LT shall be collectively called the "sense amplifier portion") handle a signal of weak amplitude on the reading global bit lines and are therefore arranged on a side which is nearer to the memory array.

To the contrary, the writing-global-bit-line precharging circuit WPC and write amplifier WA (hereinbelow, the constituents WPC and WA shall be collectively called the "write amplifier portion") are arranged on a side which is more remote from the memory array than the sense amplifier portion. The reason therefor is that the write amplifier portion handles write data having the same amplitude as that of a supply voltage and it is anticipated therefore that the effects of noise etc. may be exerted on the sense amplifier portion. Behind the latch circuit LT of the sense amplifier portion, the read data has the same amplitude as that of the supply voltage, so that the output buffer is located at the endmost position of the layout. Thus, output signal wiring lines which are connected at the rear of the output buffer can be shortened.

Figure 16:
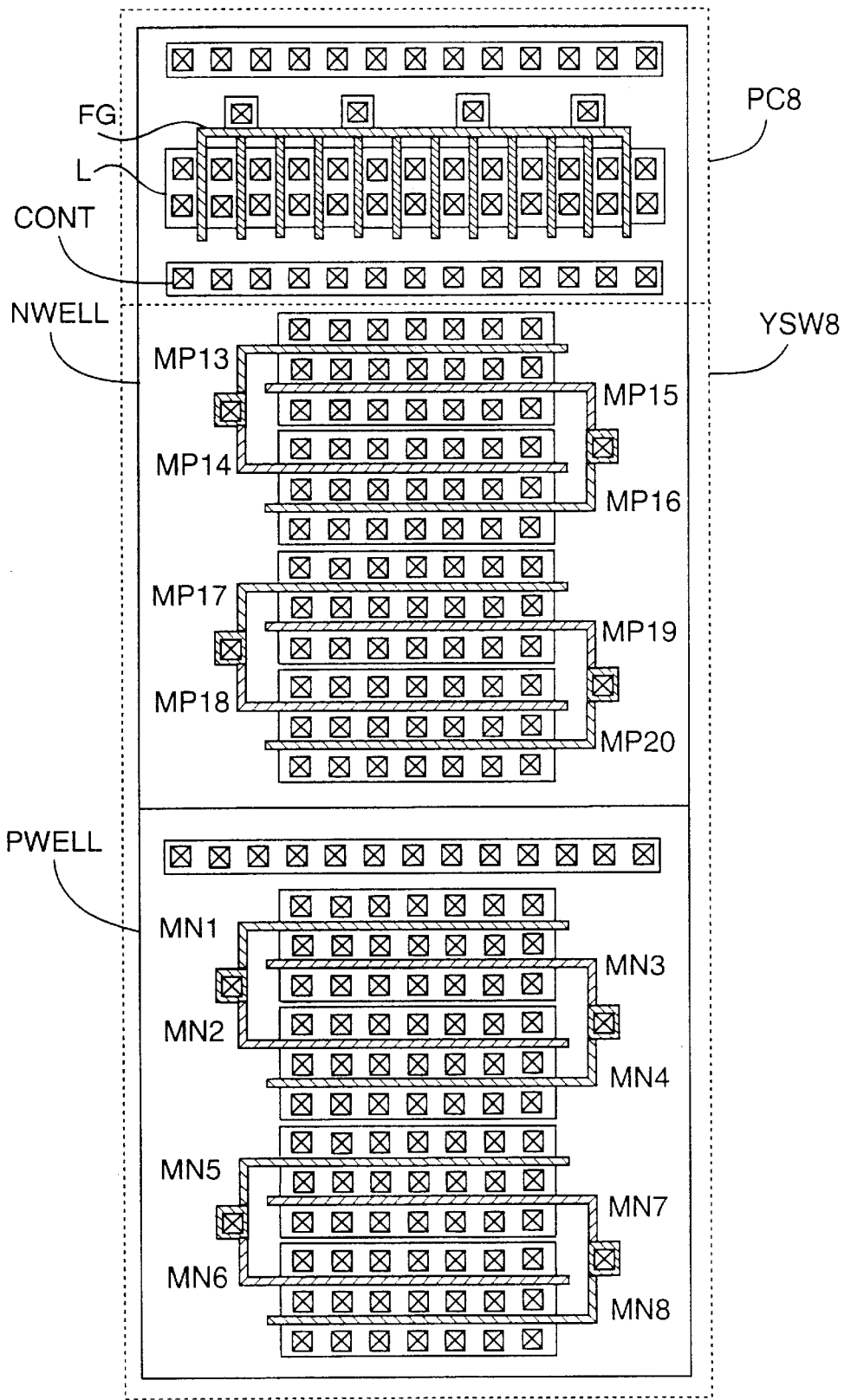
FIG. 16 is a layout view of a Y switch.

FIG. 16 is a layout view at transistor level, of the local-bit-line precharging circuit PC8 and Y switch YSW8 which are shown in FIG. 15. By the way, in this figure, only one set of global bit lines (four sets of local bit lines) are illustrated for the sake of brevity. Symbol FG denotes polycrystalline silicon which forms the gate electrodes of transistors, symbol L denotes a diffused layer, and symbol CONT a diffused layer or contact holes for connecting the polycrystalline silicon with the first layer of metal. P-channel type MOS transistors and N-channel type MOS transistors which constitute the Y switch YSW8 are respectively arranged with the gate width direction of the transistors extending laterally.

Figure 17:
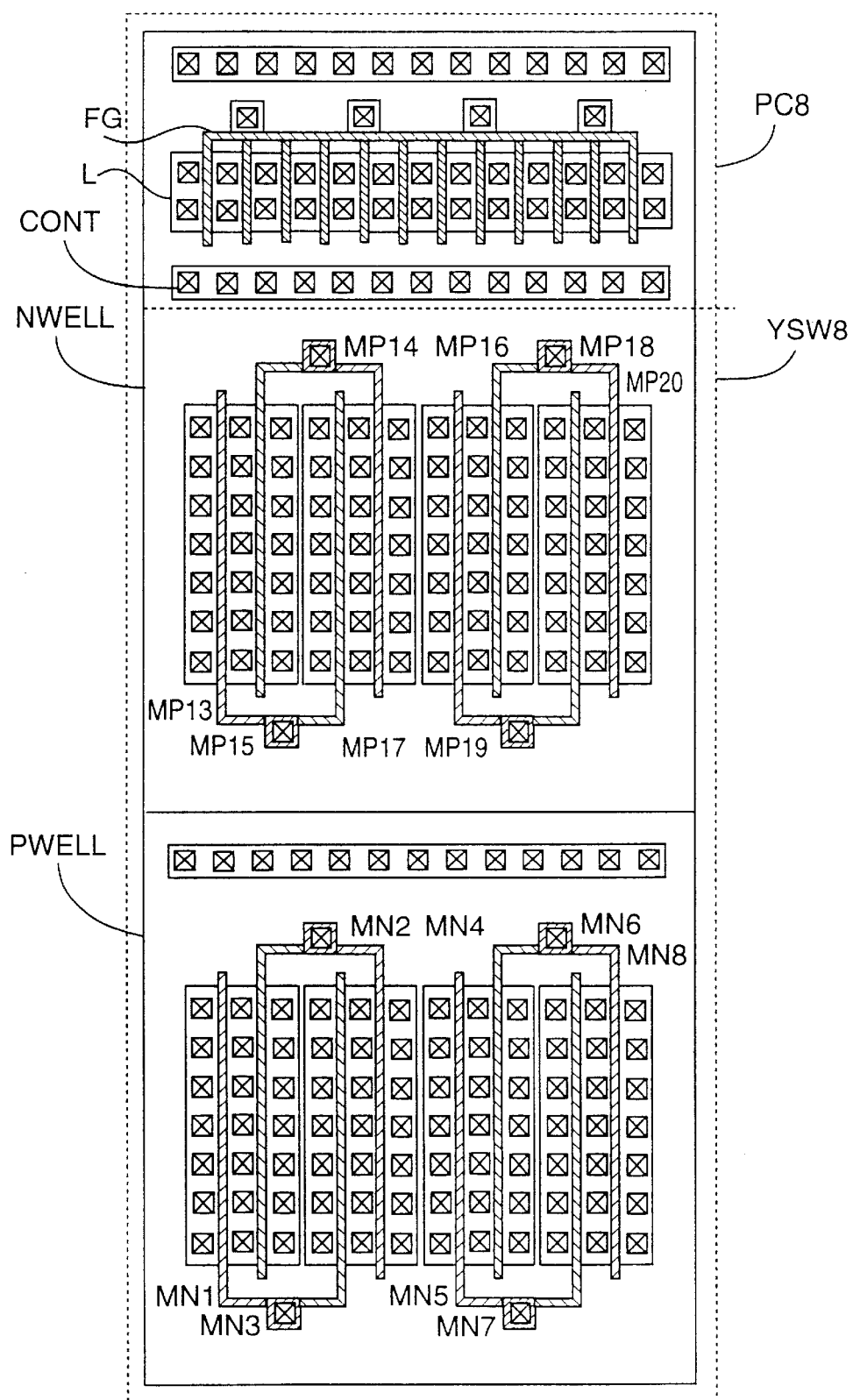
FIG. 17 is another layout view of the Y switch.

FIG. 17 illustrates an example of the case where the transistors constituting the Y switch are arranged with their gate width direction extending vertically. Whether the layout in FIG. 16 or the layout in FIG. 17 is to be employed, may be decided so that the vertical length of the layout of the Y switch portion may become smaller, depending upon the sizes of the gate widths of the transistors constituting the Y switches.

Figure 18:
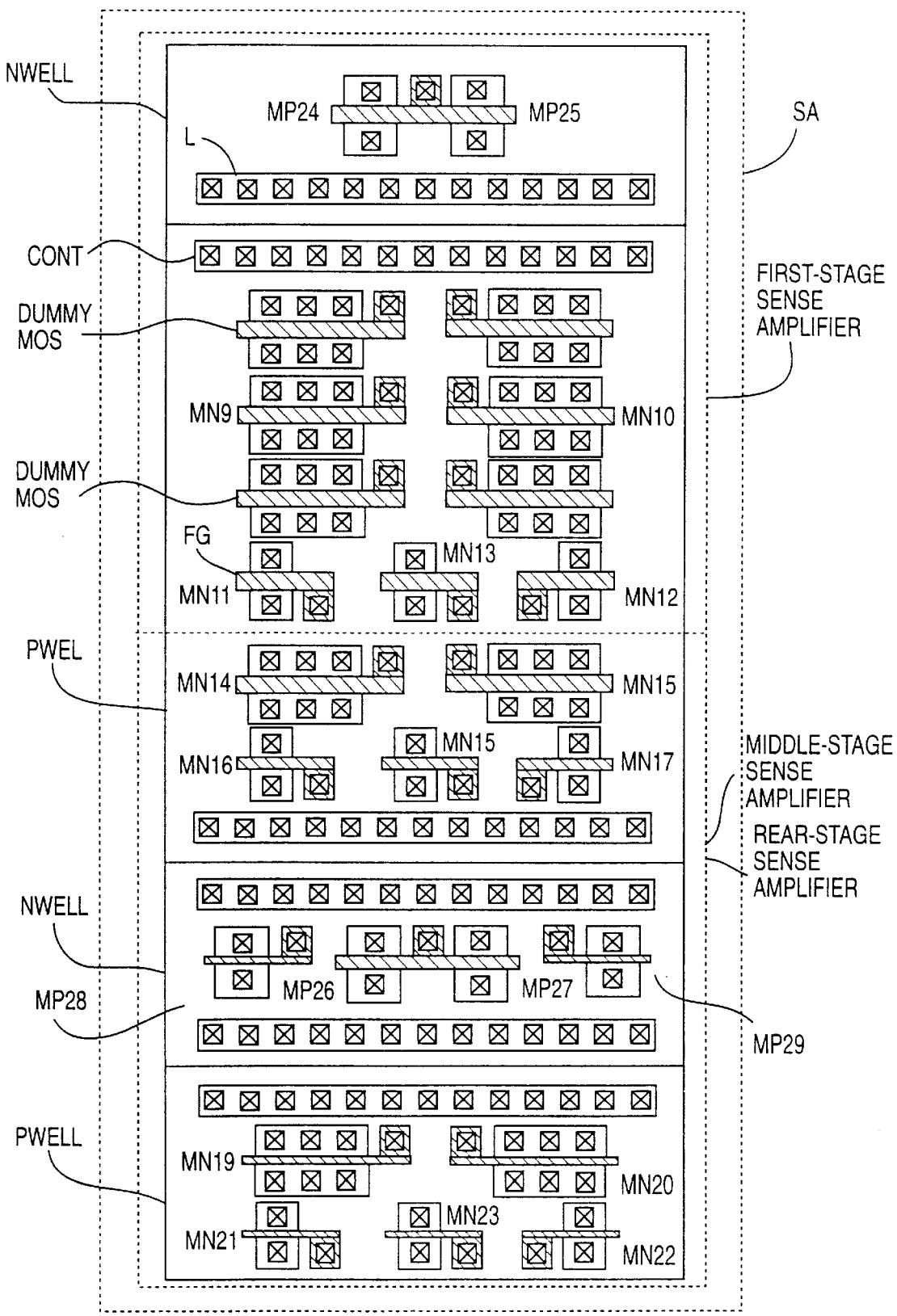
FIG. 18 is a layout view of a sense amplifier.

FIG. 18 illustrates the layout at the transistor level, of the sense amplifier SA. A first-stage sense amplifier, and middle-stage and rear-stage sense amplifiers are arrayed in this order as viewed from the upper side. Transistors constituting the first-stage sense amplifier have the gate lengths thereof set greater than those of transistors constituting the middle-stage and rear-stage sense amplifiers. This is intended to suppress the offset of the sense amplifier attributed to the manufacture related discrepancies of the transistors in the first-stage sense amplifier, and to realize a fast reading operation. Since the weak signals output from the memory cells are inputted to the first-stage sense amplifier, even a slight offset leads to the increase in reading time. Additionally, N-channel type MOS transistors which are dummy transistors are arranged above and below the N-channel type MOS transistors MN9 and MN10 to which the reading global bit lines are connected. The dummy transistors have all of their source electrodes, drain electrodes and gate electrodes connected to ground potential VSS. When the transistors MN9 and MN10 are held between the dummy transistors in this manner, the manufactural discrepancies of the gate lengths can be suppressed to relieve the offset of the sense amplifier. Moreover, since the sense amplifiers may be arranged at the rate of one for the four sets of local bit lines, they can be placed one over the other in the lateral direction like the middle-stage and rear-stage sense amplifiers. Thus, the vertical length of the sense amplifier can be shortened.

Figure 19:
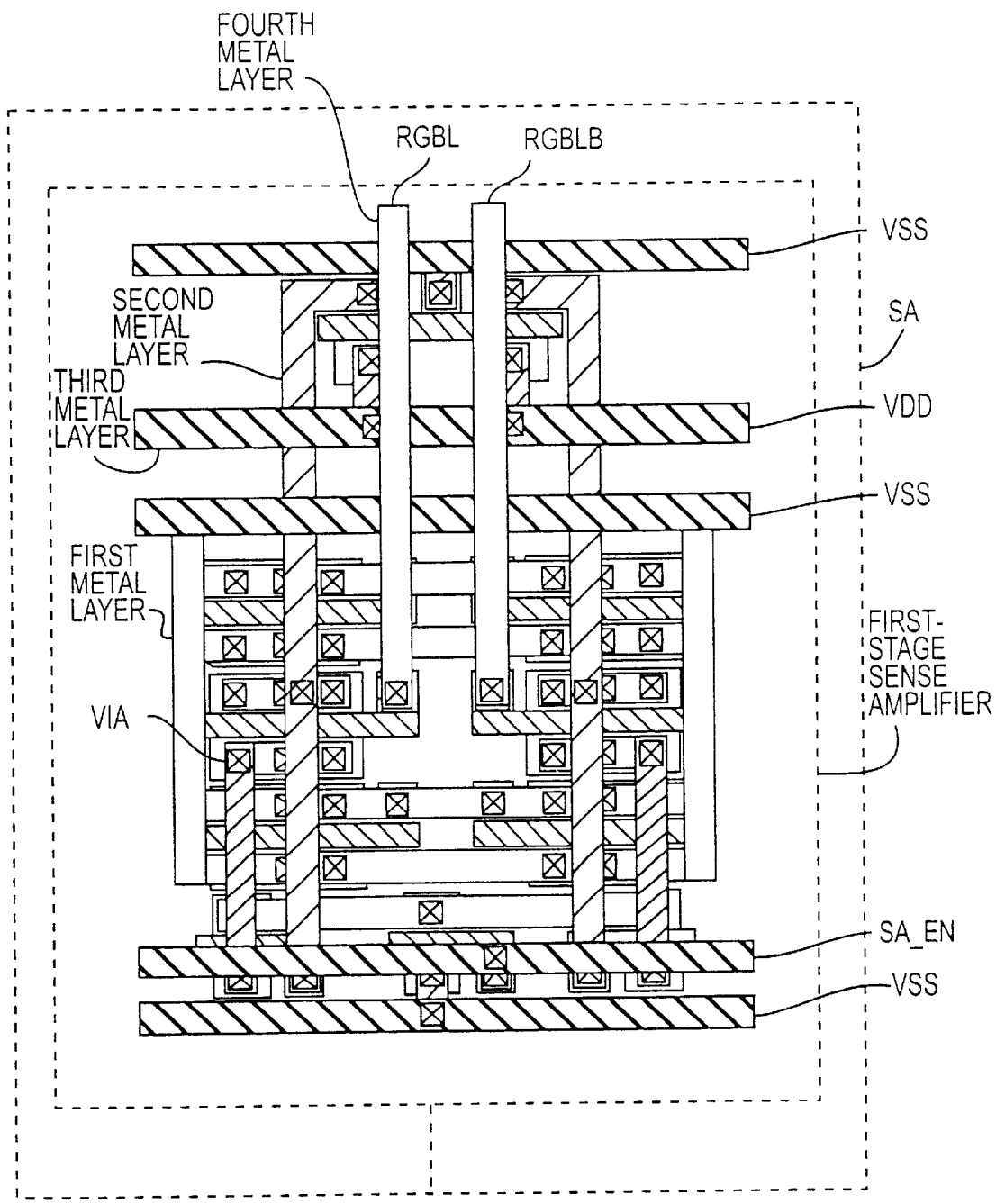
FIG. 19 is a layout view of a first-stage sense amplifier.

FIG. 19 illustrates the layout of the metal layers of the first-stage sense amplifier. A supply voltage line VDD, ground lines VSS, and a line for a sense amplifier enabling signal SA_EN are made of the third layer of metal so as to intersect (cross over) orthogonally to the reading global bit lines (RGBL, RGBLB) which are made of the fourth layer of metal. Incidentally, although the data reading global bit lines (RGBL, RGBLB) and the data writing global bit lines (WGBL, WGBLB) are respectively laid at the rate of one set to the four sets of local bit lines (LBL0, LBLB0, LBL1, LBLB1, LBL2, LBLB2, LBL3, LBLB3) in this embodiment, they may well be respectively laid at the rate of one set to eight sets of local bit lines or at the rate of one set to two sets.

Embodiment 2

Figure 20:
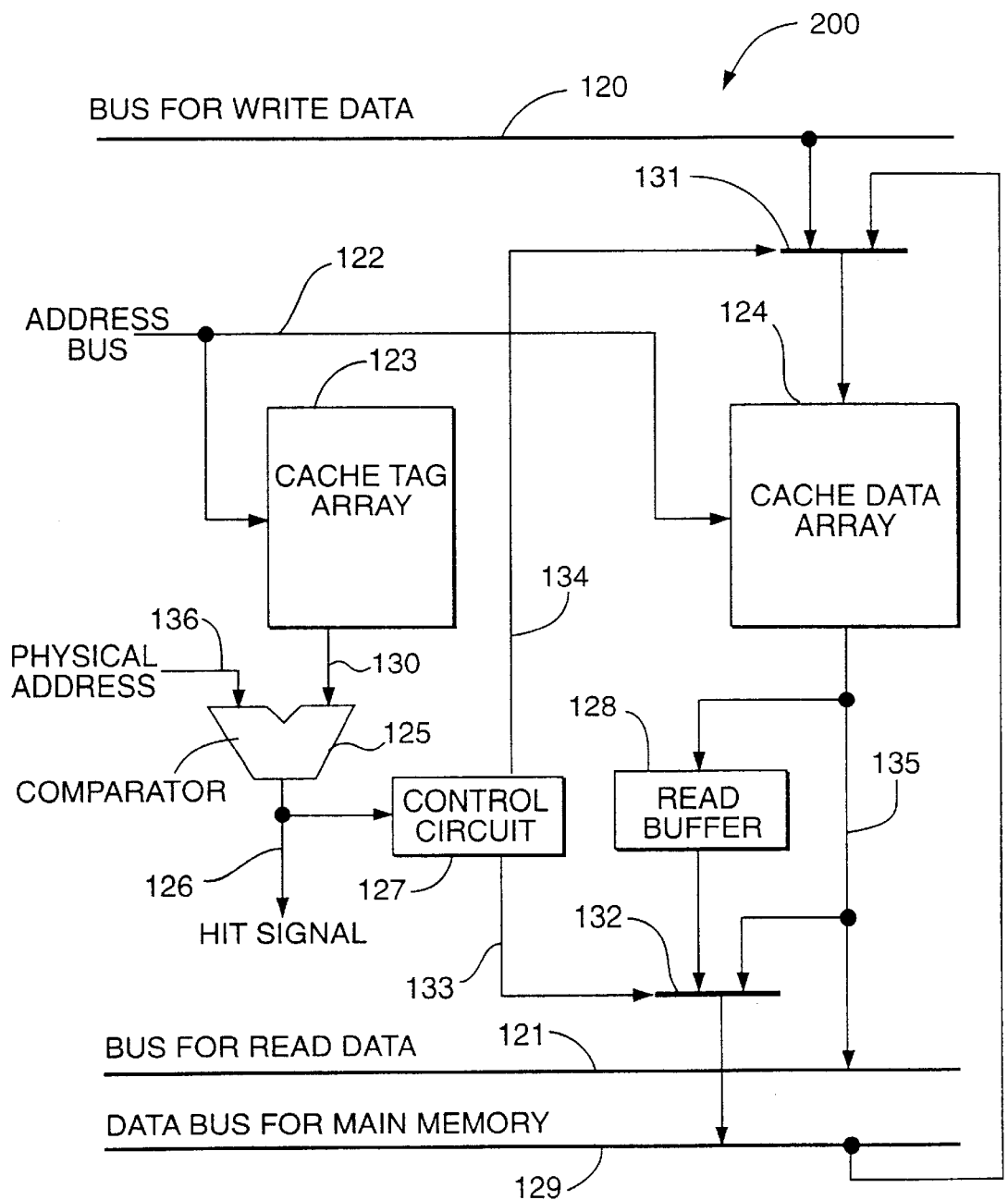
FIG. 20 is a block diagram showing a cache memory in another embodiment of the present invention.

FIG. 20 is a block diagram of a cache memory of a direct mapped system in which the semiconductor storage device according to the present invention as described in Embodiment 1 is employed as the data array of the cache memory. The cache memory 200 is formed in a monolithic semiconductor substrate such as of single-crystal silicon by the use of technologies for manufacturing semiconductor integrated circuits. The cache data array 124 is connected to an address bus 122 of 12-bit length. In addition, write data is supplied selectively from a bus 120 of 32-bit length for the write data or from a data bus 129 of 32-bit length for a main memory, while read data is delivered to a bus 121 of 32-bit length for the read data or to a read buffer 128. The input/output of data to/from the cache data array 124 is effected in 32-bit width.

The read buffer 128 is used for latching the data read out of the cache data array 124, and is constructed of a register of 32-bit width by way of example. A selector 131 selects whether the data from the write-data bus 120 or the data from the main-memory data bus 129 is to be written into the cache data array 124. The selector 131 is controlled by a control signal 134. A selector 132 selects whether data 135 read out of the cache data array 124 or the data of the read buffer 128 is to be delivered to the main-memory data bus 129. The selector 132 is controlled by a control signal 133.

A cache tag array 123 receives a tag address from the address bus 122, and delivers an address 130 to a comparator 125. The comparator 125 compares the address 130 received from the cache tag array 123, with a physical address 136 received from the address translation buffer TLB of a memory management unit not shown. In a case where the addresses have agreed, the comparator 125 delivers "H" (hit) as a hit signal 126 and sends it to a control circuit 127. In a case where the addresses have not agreed, the comparator 125 delivers "L" (miss) as the hit signal 126 and sends it to the control circuit 127. The control circuit 127 controls the selectors 131 and 132 by the control signals 134 and 133, respectively.

Figure 21:
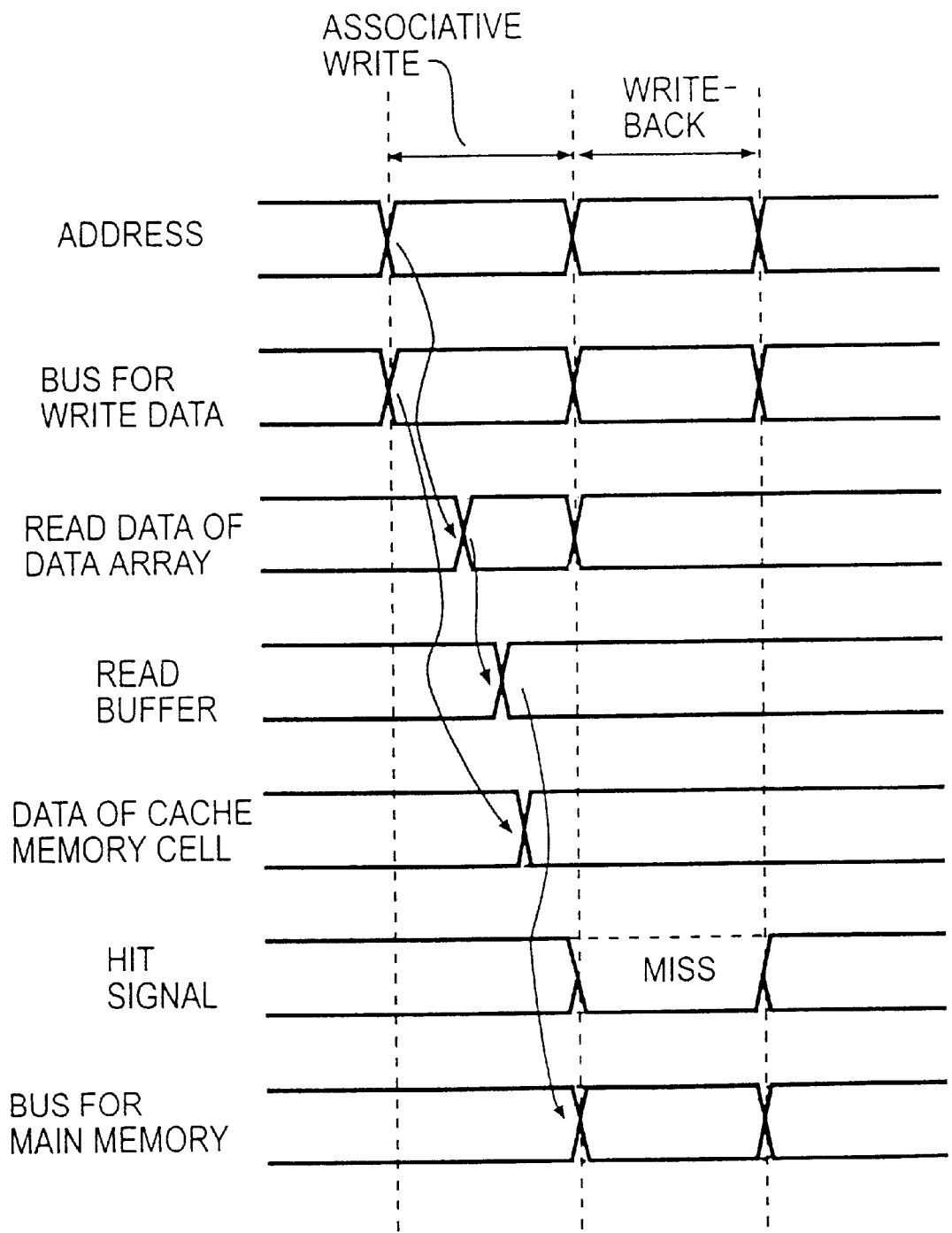
FIG. 21 is an operating waveform diagram corresponding to FIG. 20.

FIG. 21 illustrates operating waveforms in the case where the cache memory 200 in FIG. 20 has been subjected to an associative write operation and has incurred a cache miss.

In the associative write mode, an address and write data are respectively received from the address bus 122 and the write-data bus 120, and the data of a memory cell is fetched into the recovery buffer 128, whereupon the data is written into the memory cell. At the point of time at which the associative write operation has ended, the hit signal 126 is settled as to whether the write operation is allowed (hit) or rejected (miss). On condition that the hit signal 126 is "hit", the subsequent processing can be executed without any problem. In contrast, on condition that the hit signal indicates "miss", it is required to write the corresponding entry of the cache data array 124 back into the main memory. In this case, write-back processing, to be explained below, needs to be executed.

In the write-back processing, the selector 132 is controlled so as to select the data of the read buffer 128, whereby the data of the read buffer 128 is delivered to the main-memory bus, and a write request is issued to the main memory not shown. However, the possibility at which the hit signal 126 indicates the "miss" is usually low, so that the write-back processing hardly needs to be executed. Ordinarily, accordingly, the associative write operation ends in one cycle.

In an associative write operation in the prior art, data is written after a hit signal has been settled. Therefore, two cycles are required until the associative write operation ends. In contrast, this embodiment suffices with a store processing time which is half of that of the prior-art system. That is, the memory access stage of the pipeline of a microprocessor ends in one cycle, and the stream of the pipeline is not disturbed, so enhancement in high-speed performance is achieved.

We claim:

1. A semiconductor storage device, comprising:

a plurality of word lines;

a plurality of bit lines;

memory cells which are connected to said word lines and said bit lines;

sensing global bit lines which are connected to a sense amplifier;

writing global bit lines which are connected to a write amplifier; and a selection circuit which selectively connects at least one of the sensing and writing global bit lines with one of the bit lines;

wherein two adjacent ones of said writing global bit lines periodically cross over/under one another.

2. A semiconductor storage device as defined in claim 1, wherein the two adjacent writing global bit lines are arranged between two of said sensing global bit lines.

3. A semiconductor storage device as defined in claim 1 or 2, wherein the shortest distance between said writing global bit lines is longer than the shortest distance between the writing global bit line and the sensing global bit line.

4. A semiconductor storage device as defined in claim 1, wherein:

said plurality of word lines, said plurality of bit lines, and said memory cells connected to said word lines and said bit lines form a first region of rectangular shape;

a second region of rectangular shape in which said selection circuit is arranged is located along one side of said first region;

said sensing global bit lines and said writing global bit lines traverse the first and second regions in a direction which is orthogonal to said one side of said first region; and said two adjacent writing global bit lines cross over/under one another in said second region.

5. A semiconductor storage device as defined in claim 4, wherein a plurality of sets of the first and second regions are arranged in a direction in which said sensing global bit lines and said writing global bit lines extend, so as to define a train of memory banks.

6. A semiconductor storage device as defined in claim 5, wherein a third region which includes said sense amplifier and said write amplifier is provided at one end of the memory bank train.

7. A semiconductor storage device as defined in claim 6, wherein two of said memory bank trains are arranged in parallel, and a fourth region which includes a decoder/word driver is interposed between the two memory bank trains.

* * * * *